(12) United States Patent
Englhardt et al.

(10) Patent No.: US 7,819,079 B2
(45) Date of Patent: Oct. 26, 2010

(54) CARTESIAN CLUSTER TOOL CONFIGURATION FOR LITHOGRAPHY TYPE PROCESSES

(75) Inventors: Eric A. Englhardt, Palo Alto, CA (US);
Michael R. Rice, Pleasanton, CA (US);
Jeffrey C. Hudgens, San Francisco, CA (US); Steve Hongkham, San Ramon, CA (US); Jay D. Pinson, San Jose, CA (US); Mohsen Salek, Saratoga, CA (US); Charles Carlson, Cedar Park, TX (US); William T Weaver, Austin, TX (US); Helen R. Armer, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1004 days.

(21) Appl. No.: 11/530,297

(22) Filed: Sep. 8, 2006

(65) Prior Publication Data
US 2007/0144439 A1 Jun. 28, 2007

Related U.S. Application Data

(63) Continuation-in-part of application No. 11/315,984, filed on Dec. 22, 2005, now Pat. No. 7,651,306.

(60) Provisional application No. 60/673,848, filed on Apr. 22, 2005, provisional application No. 60/673,848, filed on Dec. 22, 2004.

(51) Int. Cl.
*B05C 13/02* (2006.01)
*H01L 21/677* (2006.01)
*C23C 14/00* (2006.01)

(52) U.S. Cl. .................... 118/500; 118/50; 118/503

(58) Field of Classification Search ............... 118/500, 118/503, 50, 326, 309, 634, DIG. 7; 414/217, 414/744.5, 744.6, 416.03, 935–941; 29/25.01; 204/298.25, 298.26, 298.35; 134/62, 66, 134/140, 902
See application file for complete search history.

(56) References Cited

U.S. PATENT DOCUMENTS 1,383,093 A 6/1921 Finch (Continued)

FOREIGN PATENT DOCUMENTS

DE 3790259 C2 11/1986

(Continued)

OTHER PUBLICATIONS

International Search Report. Jan. 6, 2009.

(Continued)

*Primary Examiner*—Yewebdar T Tadesse
(74) *Attorney, Agent, or Firm*—Patterson & Sheridan, LLP

(57) ABSTRACT

The present invention generally provides an apparatus and method for processing substrates using a multi-chamber processing system (e.g., a cluster tool) that is easily configurable, has an increased system throughput, increased system reliability, improved device yield performance, a more repeatable wafer processing history (or wafer history), and a reduced footprint. In one embodiment, the cluster tool is adapted to perform a track lithography process in which a substrate is coated with a photosensitive material, is then transferred to a stepper/scanner, which exposes the photosensitive material to some form of radiation to form a pattern in the photosensitive material, and then certain portions of the photosensitive material are removed in a developing process completed in the cluster tool.

11 Claims, 13 Drawing Sheets

U.S. PATENT DOCUMENTS

| | | |
|---|---|---|
| 1,927,677 A | 9/1933 | Bennington |
| 2,578,220 A | 12/1951 | Billner |
| 3,193,080 A | 7/1965 | Speaker et al. |
| 3,206,041 A | 9/1965 | McGrath |
| 3,279,625 A | 10/1966 | McConnell et al. |
| 3,351,219 A | 11/1967 | Ruderfer et al. |
| 3,402,835 A | 9/1968 | Saul |
| 3,428,195 A | 2/1969 | Pamer |
| 3,610,159 A | 10/1971 | Fickenacher |
| 3,669,206 A | 6/1972 | Tax et al. |
| 3,750,804 A | 8/1973 | Lemelson |
| 3,782,564 A | 1/1974 | Burt |
| 3,796,327 A | 3/1974 | Meyer et al. |
| 3,876,085 A | 4/1975 | Bright |
| 4,027,246 A | 5/1977 | Caccoma et al. |
| 4,197,000 A | 4/1980 | Blackwood |
| 4,303,433 A | 12/1981 | Langowski |
| 4,319,689 A | 3/1982 | Clapp |
| 4,348,044 A | 9/1982 | Wood, III |
| 4,410,209 A | 10/1983 | Trapani |
| 4,609,575 A | 9/1986 | Burkman |
| 4,634,655 A | 1/1987 | Yanagimoto et al. |
| 4,639,028 A | 1/1987 | Olson |
| 4,664,133 A | 5/1987 | Silvernail |
| 4,682,614 A | 7/1987 | Silvernail |
| 4,715,637 A | 12/1987 | Hosoda et al. |
| 4,750,505 A | 6/1988 | Inuta et al. |
| 4,755,257 A | 7/1988 | Yamamoto et al. |
| 4,756,047 A | 7/1988 | Hayashi et al. |
| 4,774,552 A | 9/1988 | Nishihama et al. |
| 4,778,332 A | 10/1988 | Byers et al. |
| 4,788,994 A | 12/1988 | Shinbara |
| 4,803,734 A | 2/1989 | Onishi et al. |
| 4,830,888 A | 5/1989 | Kobayashi et al. |
| 4,838,979 A | 6/1989 | Nishida et al. |
| 4,844,746 A | 7/1989 | Hormann et al. |
| 4,846,623 A | 7/1989 | Otani et al. |
| 4,855,775 A | 8/1989 | Matsuoka |
| 4,856,641 A | 8/1989 | Matsumura et al. |
| 4,857,949 A | 8/1989 | Masuda et al. |
| 4,870,923 A | 10/1989 | Sugimoto |
| 4,871,417 A | 10/1989 | Nishizawa et al. |
| 4,892,761 A | 1/1990 | Yamada |
| 4,895,604 A | 1/1990 | Hayashi |
| 4,899,686 A | 2/1990 | Toshima et al. |
| 4,900,214 A | 2/1990 | Ben |
| 4,911,761 A | 3/1990 | McConnell et al. |
| 4,917,123 A | 4/1990 | McConnell et al. |
| 4,919,073 A | 4/1990 | Kobayashi et al. |
| 4,922,278 A | 5/1990 | Takeda et al. |
| 4,923,054 A | 5/1990 | Ohtani et al. |
| 4,924,073 A | 5/1990 | Chiba |
| 4,924,800 A | 5/1990 | Tanaka |
| 4,966,094 A | 10/1990 | Yamada |
| 4,982,694 A | 1/1991 | Moriyama |
| 4,984,597 A | 1/1991 | McConnell et al. |
| 4,985,720 A | 1/1991 | Masuda et al. |
| 4,987,687 A | 1/1991 | Sugimoto |
| 4,998,021 A | 3/1991 | Mimasaka |
| 5,002,008 A | 3/1991 | Ushijima et al. |
| 5,020,200 A | 6/1991 | Mimasaka et al. |
| 5,031,474 A | 7/1991 | Keppler et al. |
| 5,032,217 A | 7/1991 | Tanaka |
| 5,035,200 A | 7/1991 | Moriyama |
| 5,054,332 A | 10/1991 | Terauchi et al. |
| 5,061,144 A | 10/1991 | Akimoto et al. |
| 5,065,178 A | 11/1991 | Awazu et al. |
| 5,070,813 A | 12/1991 | Sakai et al. |
| 5,078,832 A | 1/1992 | Tanaka |
| 5,089,305 A | 2/1992 | Ushijima et al. |
| 5,125,790 A | 6/1992 | Foulke et al. |
| 5,127,362 A | 7/1992 | Iwatsu et al. |
| 5,133,635 A | 7/1992 | Malin et al. |
| 5,151,871 A | 9/1992 | Matsumura et al. |
| 5,169,408 A | 12/1992 | Biggerstaff |
| 5,174,855 A | 12/1992 | Tanaka |
| 5,180,431 A | 1/1993 | Sugimoto et al. |
| 5,197,846 A | 3/1993 | Uno et al. |
| 5,201,653 A | 4/1993 | Hasegawa et al. |
| 5,209,180 A | 5/1993 | Shoda et al. |
| 5,234,499 A | 8/1993 | Sasaki et al. |
| 5,240,556 A | 8/1993 | Ishikawa et al. |
| 5,250,114 A | 10/1993 | Konishi et al. |
| 5,252,137 A | 10/1993 | Tateyama et al. |
| 5,254,367 A | 10/1993 | Masumura et al. |
| D341,428 S | 11/1993 | Akimoto et al. |
| 5,275,658 A | 1/1994 | Kimura |
| 5,307,109 A | 4/1994 | Miyasaka et al. |
| 5,308,210 A | 5/1994 | Ohtani et al. |
| 5,312,487 A | 5/1994 | Akimoto et al. |
| 5,322,079 A | 6/1994 | Fukutomi et al. |
| 5,331,987 A | 7/1994 | Hayashi et al. |
| 5,339,128 A | 8/1994 | Tateyama et al. |
| 5,349,412 A | 9/1994 | Miyasaka |
| 5,359,785 A | 11/1994 | Fukutomi et al. |
| 5,374,312 A | 12/1994 | Hasebe et al. |
| 5,376,216 A | 12/1994 | Yoshioka et al. |
| 5,401,316 A | 3/1995 | Shiraishi et al. |
| 5,405,443 A | 4/1995 | Akimoto et al. |
| 5,411,076 A | 5/1995 | Matsunaga et al. |
| 5,415,890 A | 5/1995 | Kloiber et al. |
| 5,416,047 A | 5/1995 | Konishi et al. |
| 5,418,382 A | 5/1995 | Blackwood et al. |
| 5,427,820 A | 6/1995 | Biche et al. |
| 5,430,271 A | 7/1995 | Orgami et al. |
| 5,431,700 A | 7/1995 | Sloan |
| 5,436,848 A | 7/1995 | Nishida et al. |
| 5,438,209 A | 8/1995 | Yamamoto et al. |
| 5,443,348 A | 8/1995 | Biche et al. |
| 5,485,644 A | 1/1996 | Shinbara et al. |
| 5,501,870 A | 3/1996 | Shiraishi et al. |
| 5,505,781 A | 4/1996 | Omori et al. |
| 5,514,215 A | 5/1996 | Takamatsu et al. |
| 5,514,852 A | 5/1996 | Takamori et al. |
| 5,520,501 A | 5/1996 | Kouno et al. |
| 5,520,744 A | 5/1996 | Fujikawa et al. |
| 5,522,215 A | 6/1996 | Matsunaga et al. |
| 5,536,918 A | 7/1996 | Ohkase et al. |
| 5,553,994 A | 9/1996 | Biche et al. |
| 5,555,234 A | 9/1996 | Sugimoto |
| 5,571,325 A | 11/1996 | Ueyama et al. |
| 5,580,607 A | 12/1996 | Takekuma et al. |
| 5,599,394 A | 2/1997 | Yabe et al. |
| 5,601,645 A | 2/1997 | Nonomura et al. |
| 5,608,943 A | 3/1997 | Konishi et al. |
| 5,611,685 A | 3/1997 | Nakajima et al. |
| 5,618,348 A | 4/1997 | Tran |
| 5,620,560 A | 4/1997 | Akimoto et al. |
| 5,625,433 A | 4/1997 | Inada et al. |
| 5,626,913 A | 5/1997 | Tomoeda et al. |
| 5,633,040 A | 5/1997 | Toshima et al. |
| 5,634,377 A | 6/1997 | Kimura et al. |
| 5,636,964 A | 6/1997 | Somekh et al. |
| 5,638,687 A | 6/1997 | Mizohata et al. |
| 5,639,301 A | 6/1997 | Sasada et al. |
| 5,651,823 A | 7/1997 | Parodi et al. |
| 5,658,615 A | 8/1997 | Hasebe et al. |
| 5,665,200 A | 9/1997 | Fujimoto et al. |
| 5,668,733 A | 9/1997 | Morimoto et al. |
| 5,670,210 A | 9/1997 | Mandal et al. |
| 5,672,205 A | 9/1997 | Fujimoto et al. |
| 5,674,410 A | 10/1997 | Nakajima et al. |
| 5,677,000 A | 10/1997 | Yoshioka et al. |
| 5,681,614 A | 10/1997 | Omori et al. |

| | | | | | |
|---|---|---|---|---|---|
| 5,687,085 A | 11/1997 | Morimoto et al. | 5,942,035 A | 8/1999 | Hasebe et al. |
| 5,688,322 A | 11/1997 | Motoda et al. | 5,943,726 A | 8/1999 | Eitoku et al. |
| 5,688,324 A | 11/1997 | Umaba | 5,943,880 A | 8/1999 | Tateyama et al. |
| 5,688,326 A | 11/1997 | Kandori et al. | 5,945,161 A | 8/1999 | Hashimoto et al. |
| 5,689,749 A | 11/1997 | Tanaka et al. | 5,960,225 A | 9/1999 | Fujimoto |
| 5,695,817 A | 12/1997 | Tateyama et al. | 5,961,269 A | 10/1999 | Kroeker |
| 5,700,046 A | 12/1997 | Van Doren et al. | 5,962,070 A | 10/1999 | Mitsuhashi et al. |
| 5,701,627 A | 12/1997 | Matsumura et al. | 5,963,753 A | 10/1999 | Ohtani et al. |
| 5,702,228 A | 12/1997 | Tamai et al. | 5,965,200 A | 10/1999 | Tateyama et al. |
| 5,704,493 A | 1/1998 | Fujikawa et al. | 5,968,268 A | 10/1999 | Kitano et al. |
| 5,711,809 A | 1/1998 | Kimura et al. | 5,968,691 A | 10/1999 | Yoshioka et al. |
| 5,715,173 A | 2/1998 | Nakajima et al. | 5,970,717 A | 10/1999 | Tateyama et al. |
| 5,730,574 A | 3/1998 | Adachi et al. | 5,972,110 A | 10/1999 | Akimoto |
| 5,733,024 A | 3/1998 | Slocum et al. | 5,974,682 A | 11/1999 | Akimoto et al. |
| 5,762,684 A | 6/1998 | Hayashi et al. | 5,976,256 A | 11/1999 | Kawano |
| 5,762,708 A | 6/1998 | Motoda et al. | 5,976,620 A | 11/1999 | Sanada et al. |
| 5,762,709 A | 6/1998 | Sugimoto et al. | 5,984,540 A | 11/1999 | Mimasaka et al. |
| 5,762,745 A | 6/1998 | Hirose | 5,985,357 A | 11/1999 | Sanada |
| 5,763,892 A | 6/1998 | Kizaki et al. | 5,988,971 A | 11/1999 | Fossey et al. |
| 5,765,072 A | 6/1998 | Ohtani et al. | 5,989,342 A | 11/1999 | Ikeda et al. |
| 5,765,444 A | 6/1998 | Bacchi et al. | 5,989,346 A | 11/1999 | Hiroki |
| 5,766,671 A | 6/1998 | Matsui | 5,989,632 A | 11/1999 | Sanada et al. |
| 5,766,824 A | 6/1998 | Batchelder et al. | 5,992,431 A | 11/1999 | Weber et al. |
| 5,772,764 A | 6/1998 | Akimoto | 5,993,518 A | 11/1999 | Tateyama |
| 5,779,796 A | 7/1998 | Tomoeda et al. | 6,000,862 A | 12/1999 | Okuda |
| 5,788,453 A | 8/1998 | Donde et al. | 6,002,108 A | 12/1999 | Yoshioka |
| 5,788,742 A | 8/1998 | Sugimoto et al. | 6,004,047 A | 12/1999 | Akimoto et al. |
| 5,788,773 A | 8/1998 | Okuda et al. | 6,007,629 A | 12/1999 | Ohtani et al. |
| 5,788,868 A | 8/1998 | Itaba et al. | 6,010,570 A | 1/2000 | Motoda et al. |
| 5,792,259 A | 8/1998 | Yoshioka et al. | 6,012,192 A | 1/2000 | Sawada et al. |
| 5,803,932 A | 9/1998 | Akimoto et al. | 6,012,858 A | 1/2000 | Konishi et al. |
| 5,803,970 A | 9/1998 | Tateyama et al. | 6,013,317 A | 1/2000 | Motoda et al. |
| 5,817,156 A | 10/1998 | Tateyama et al. | 6,015,066 A | 1/2000 | Kimura et al. |
| 5,823,736 A | 10/1998 | Matsumura | 6,017,663 A | 1/2000 | Yaegashi et al. |
| 5,826,130 A | 10/1998 | Tanaka et al. | 6,018,616 A | 1/2000 | Schaper |
| 5,834,737 A | 11/1998 | Hirose et al. | 6,021,790 A | 2/2000 | Yoshitani et al. |
| 5,838,121 A | 11/1998 | Fairbairn et al. | 6,033,475 A | 3/2000 | Hasebe et al. |
| 5,839,011 A | 11/1998 | Urasaki et al. | 6,040,120 A | 3/2000 | Matsushita et al. |
| 5,841,515 A | 11/1998 | Ohtani | 6,048,400 A | 4/2000 | Ohtani |
| 5,843,527 A | 12/1998 | Sanada | 6,051,101 A | 4/2000 | Ohtani et al. |
| 5,845,170 A | 12/1998 | Ogata | 6,051,349 A | 4/2000 | Yoshioka |
| 5,846,327 A | 12/1998 | Kawamoto et al. | 6,053,058 A | 4/2000 | Hayashi et al. |
| 5,853,483 A | 12/1998 | Morita et al. | 6,053,977 A | 4/2000 | Konishi |
| 5,853,812 A | 12/1998 | Kawasaki et al. | 6,056,998 A | 5/2000 | Fujimoto |
| 5,854,953 A | 12/1998 | Semba | 6,059,880 A | 5/2000 | Kitano et al. |
| 5,866,307 A | 2/1999 | Kiba et al. | 6,060,697 A | 5/2000 | Morita et al. |
| 5,867,389 A | 2/1999 | Hamada et al. | 6,062,240 A | 5/2000 | Sada et al. |
| 5,871,584 A | 2/1999 | Tateyama et al. | 6,062,288 A | 5/2000 | Tateyama |
| 5,875,804 A | 3/1999 | Tanaka et al. | 6,062,852 A | 5/2000 | Kawamoto et al. |
| 5,881,750 A | 3/1999 | Yoshitani | 6,063,190 A | 5/2000 | Hasebe et al. |
| 5,887,214 A | 3/1999 | Kuriu et al. | 6,063,439 A | 5/2000 | Semba et al. |
| 5,888,344 A | 3/1999 | Ogami et al. | 6,067,727 A | 5/2000 | Muraoka |
| 5,898,588 A | 4/1999 | Morimoto | 6,074,515 A | 6/2000 | Iseki et al. |
| 5,904,169 A | 5/1999 | Yoshitani | 6,076,652 A | 6/2000 | Head et al. |
| 5,906,469 A | 5/1999 | Oka et al. | 6,076,979 A | 6/2000 | Mimasaka et al. |
| 5,906,860 A | 5/1999 | Motoda et al. | 6,077,321 A | 6/2000 | Adachi et al. |
| 5,908,657 A | 6/1999 | Kimura et al. | 6,087,632 A | 7/2000 | Mizosaki et al. |
| 5,912,054 A | 6/1999 | Tateyama | 6,089,762 A | 7/2000 | Mimasaka et al. |
| 5,915,396 A | 6/1999 | Kinose | 6,092,971 A | 7/2000 | Balg et al. |
| 5,916,366 A | 6/1999 | Ueyama et al. | 6,097,005 A | 8/2000 | Akimoto |
| 5,919,520 A | 7/1999 | Tateyama et al. | 6,099,643 A | 8/2000 | Ohtani et al. |
| 5,919,529 A | 7/1999 | Matsumura et al. | 6,104,002 A | 8/2000 | Hirose et al. |
| 5,921,257 A | 7/1999 | Weber et al. | 6,108,932 A | 8/2000 | Chai |
| 5,923,915 A | 7/1999 | Akimoto et al. | 6,109,677 A | 8/2000 | Anthony |
| 5,927,077 A | 7/1999 | Hisai et al. | 6,113,695 A | 9/2000 | Fujimoto |
| 5,927,303 A | 7/1999 | Miya et al. | 6,116,848 A | 9/2000 | Thomas et al. |
| 5,932,380 A | 8/1999 | Yaegashi et al. | 6,117,486 A | 9/2000 | Yoshihara |
| 5,935,768 A | 8/1999 | Biche et al. | 6,120,834 A | 9/2000 | Terauchi |
| 5,938,847 A | 8/1999 | Akimoto et al. | 6,124,211 A | 9/2000 | Butterbaugh et al. |
| 5,938,902 A | 8/1999 | Nguyen et al. | 6,126,725 A | 10/2000 | Tateyama |
| 5,939,130 A | 8/1999 | Shiraishi et al. | 6,128,829 A | 10/2000 | Wolke et al. |
| 5,941,083 A | 8/1999 | Sada et al. | 6,129,546 A | 10/2000 | Sada |
| 5,942,013 A * | 8/1999 | Akimoto .................. 29/25.01 | 6,132,165 A | 10/2000 | Carducci |

| | | | | | | |
|---|---|---|---|---|---|---|
| 6,138,695 | A | 10/2000 | Shibao et al. | 6,300,043 | B1 | 10/2001 | Konishi et al. |
| 6,142,722 | A | 11/2000 | Genov et al. | 6,302,960 | B1 | 10/2001 | Baroudi et al. |
| 6,143,087 | A | 11/2000 | Walter | 6,306,455 | B1 | 10/2001 | Takamori et al. |
| 6,143,478 | A | 11/2000 | Toshima et al. | 6,312,177 | B1 | 11/2001 | Nureki |
| 6,147,329 | A | 11/2000 | Okamura et al. | 6,313,441 | B1 | 11/2001 | Schaper et al. |
| 6,149,727 | A | 11/2000 | Yoshioka et al. | 6,313,903 | B1 | 11/2001 | Ogata |
| 6,155,275 | A | 12/2000 | Shinbara | 6,318,948 | B1 | 11/2001 | Ueda et al. |
| 6,156,125 | A | 12/2000 | Harada | 6,318,951 | B1 | 11/2001 | Schmidt et al. |
| 6,158,446 | A | 12/2000 | Mohindra | 6,319,317 | B1 | 11/2001 | Takamori |
| 6,159,291 | A | 12/2000 | Morita et al. | 6,322,119 | B1 | 11/2001 | Schmidt et al. |
| 6,159,541 | A | 12/2000 | Sakai et al. | 6,327,793 | B1 | 12/2001 | Gurer et al. |
| 6,165,273 | A | 12/2000 | Fayefield | 6,332,723 | B1 | 12/2001 | Matsuyama et al. |
| 6,167,322 | A | 12/2000 | Holbrooks | 6,336,204 | B1 | 1/2002 | Jevtic |
| 6,168,665 | B1 | 1/2001 | Sakai et al. | 6,340,643 | B2 | 1/2002 | Ueda |
| 6,169,274 | B1 | 1/2001 | Kulp | 6,348,101 | B1 | 2/2002 | Walter |
| 6,174,371 | B1 | 1/2001 | Iseki et al. | 6,352,083 | B1 | 3/2002 | Araki et al. |
| 6,176,667 | B1 | 1/2001 | Fairbairn et al. | 6,354,311 | B1 | 3/2002 | Kimura et al. |
| 6,177,133 | B1 | 1/2001 | Gurer et al. | 6,359,264 | B1 | 3/2002 | Schaper et al. |
| 6,179,982 | B1 | 1/2001 | Chiu et al. | 6,361,600 | B1 | 3/2002 | Tateyama et al. |
| 6,183,147 | B1 | 2/2001 | Kimura et al. | 6,364,547 | B1 | 4/2002 | Matsuyama et al. |
| 6,185,370 | B1 | 2/2001 | Sekimoto et al. | 6,368,776 | B1 | 4/2002 | Harada et al. |
| 6,190,063 | B1 | 2/2001 | Akimoto | 6,371,667 | B1 | 4/2002 | Kitano et al. |
| 6,191,394 | B1 | 2/2001 | Shirakawa et al. | 6,371,713 | B1 | 4/2002 | Nishimura et al. |
| 6,193,783 | B1 | 2/2001 | Sakamoto et al. | 6,379,056 | B1 | 4/2002 | Ueda et al. |
| 6,199,568 | B1 | 3/2001 | Arai et al. | 6,380,518 | B2 | 4/2002 | Shirakawa et al. |
| 6,200,633 | B1 | 3/2001 | Kitano et al. | 6,382,849 | B1 | 5/2002 | Sakamoto et al. |
| 6,202,653 | B1 | 3/2001 | Harada et al. | 6,383,948 | B1 | 5/2002 | Kitano et al. |
| 6,203,969 | B1 | 3/2001 | Ueda | 6,384,894 | B2 | 5/2002 | Matsuyama et al. |
| 6,207,231 | B1 | 3/2001 | Tateyama | 6,391,111 | B1 | 5/2002 | Fujimoto et al. |
| 6,210,481 | B1 | 4/2001 | Sakai et al. | 6,398,429 | B1 | 6/2002 | Toshima et al. |
| 6,216,475 | B1 | 4/2001 | Sada et al. | 6,401,353 | B2 | 6/2002 | Kimura |
| 6,217,657 | B1 | 4/2001 | Kiba et al. | 6,402,399 | B2 | 6/2002 | Sakamoto et al. |
| 6,221,787 | B1 | 4/2001 | Ogata | 6,402,400 | B1 | 6/2002 | Ueda et al. |
| 6,222,161 | B1 | 4/2001 | Shirakawa et al. | 6,402,508 | B2 | 6/2002 | Harada et al. |
| 6,227,786 | B1 | 5/2001 | Tateyama | 6,402,509 | B1 | 6/2002 | Ookura et al. |
| 6,228,171 | B1 | 5/2001 | Shirakawa et al. | 6,402,844 | B1 | 6/2002 | Harada et al. |
| 6,228,561 | B1 | 5/2001 | Hasebe | 6,403,924 | B1 | 6/2002 | Hayashi |
| 6,229,116 | B1 | 5/2001 | Shirakawa et al. | 6,410,194 | B1 | 6/2002 | Yoshihara |
| 6,235,641 | B1 | 5/2001 | Christenson | 6,416,583 | B1 | 7/2002 | Kitano et al. |
| 6,238,107 | B1 | 5/2001 | Inada | 6,418,356 | B1 | 7/2002 | Oh |
| 6,238,109 | B1 | 5/2001 | Minami | 6,419,408 | B1 | 7/2002 | Inada |
| 6,238,735 | B1 | 5/2001 | Mandal et al. | 6,431,769 | B1 | 8/2002 | Fukuda et al. |
| 6,238,848 | B1 | 5/2001 | Konishi et al. | 6,432,199 | B1 | 8/2002 | Takekuma |
| 6,241,402 | B1 | 6/2001 | Sakamoto et al. | 6,438,449 | B2 | 8/2002 | Kawamatsu et al. |
| 6,241,403 | B1 | 6/2001 | Sakamoto et al. | 6,438,460 | B1 | 8/2002 | Bacchi et al. |
| 6,246,030 | B1 | 6/2001 | Matsuyama | 6,440,218 | B1 | 8/2002 | Sanada et al. |
| 6,248,398 | B1 | 6/2001 | Talieh et al. | 6,443,641 | B2 | 9/2002 | Takamori et al. |
| 6,251,195 | B1 | 6/2001 | Wagoner | 6,444,029 | B1 | 9/2002 | Kimura et al. |
| 6,253,118 | B1 | 6/2001 | Koyama | 6,446,646 | B1 | 9/2002 | Izumi |
| 6,254,936 | B1 | 7/2001 | Gurer et al. | 6,447,608 | B1 | 9/2002 | Sakai et al. |
| 6,256,555 | B1 | 7/2001 | Bacchi et al. | 6,450,803 | B1 | 9/2002 | Shirakawa et al. |
| 6,257,778 | B1 | 7/2001 | Toshima et al. | 6,450,805 | B1 | 9/2002 | Oda et al. |
| 6,258,167 | B1 | 7/2001 | Kawano et al. | 6,451,515 | B2 | 9/2002 | Takamori et al. |
| 6,260,562 | B1 | 7/2001 | Morinishi et al. | 6,453,214 | B1 | 9/2002 | Bacchi et al. |
| 6,261,007 | B1 | 7/2001 | Takamori et al. | 6,454,332 | B1 | 9/2002 | Govzman et al. |
| 6,261,365 | B1 | 7/2001 | Matsuyama et al. | 6,458,208 | B1 | 10/2002 | Anai et al. |
| 6,261,744 | B1 | 7/2001 | Yoshioka | 6,458,607 | B1 | 10/2002 | Anai et al. |
| 6,266,125 | B1 | 7/2001 | Fukuda et al. | 6,461,438 | B1 | 10/2002 | Ookura et al. |
| 6,267,022 | B1 | 7/2001 | Suzuki | 6,464,789 | B1 | 10/2002 | Akimoto et al. |
| 6,267,516 | B1 | 7/2001 | Nagamine et al. | 6,465,765 | B2 | 10/2002 | Katayama et al. |
| 6,268,013 | B1 | 7/2001 | Akimoto et al. | 6,468,586 | B1 | 10/2002 | Gurer et al. |
| 6,273,104 | B1 | 8/2001 | Shinbara et al. | 6,471,421 | B2 | 10/2002 | Kitamura |
| 6,275,748 | B1 | 8/2001 | Bacchi et al. | 6,471,422 | B1 | 10/2002 | Ueda et al. |
| 6,278,089 | B1 | 8/2001 | Young et al. | 6,474,986 | B2 | 11/2002 | Oda et al. |
| 6,281,145 | B1 | 8/2001 | Deguchi et al. | 6,475,279 | B1 | 11/2002 | Akimoto et al. |
| 6,283,701 | B1 | 9/2001 | Sundar et al. | 6,485,782 | B2 | 11/2002 | Takamori |
| 6,284,043 | B1 | 9/2001 | Takekuma | 6,485,893 | B1 | 11/2002 | Matsuyama |
| 6,284,616 | B1 | 9/2001 | Smith | 6,491,452 | B2 | 12/2002 | Konishi et al. |
| 6,287,390 | B2 | 9/2001 | Sakai et al. | 6,491,491 | B1 | 12/2002 | Tsuneda et al. |
| 6,291,800 | B1 | 9/2001 | Shirakawa et al. | 6,496,245 | B2 | 12/2002 | Kosugi et al. |
| 6,292,250 | B1 | 9/2001 | Matsuyama | 6,501,191 | B2 | 12/2002 | Tanaka et al. |
| 6,293,713 | B1 | 9/2001 | Ueda | 6,503,003 | B2 | 1/2003 | Hasebe et al. |
| 6,299,938 | B1 | 10/2001 | Tateyama | 6,507,770 | B2 | 1/2003 | Tateyama et al. |

| | | |
|---|---|---|
| 6,511,315 B2 | 1/2003 | Hashimoto |
| 6,514,073 B1 | 2/2003 | Toshima et al. |
| 6,514,343 B1 | 2/2003 | Motoda et al. |
| 6,514,344 B2 | 2/2003 | Kitano et al. |
| 6,514,570 B1 | 2/2003 | Matsuyama et al. |
| 6,518,199 B2 | 2/2003 | Kitano et al. |
| 6,526,329 B2 | 2/2003 | Tateyama et al. |
| 6,527,860 B1 | 3/2003 | Yoshihara et al. |
| 6,527,861 B2 | 3/2003 | Takekuma |
| 6,533,531 B1 | 3/2003 | Nguyen et al. |
| 6,533,864 B1 | 3/2003 | Matsuyama et al. |
| 6,534,750 B1 | 3/2003 | Tanoue et al. |
| 6,536,964 B1 | 3/2003 | Kitano et al. |
| 6,537,373 B1 | 3/2003 | Kitano et al. |
| 6,539,956 B1 | 4/2003 | Wolke et al. |
| 6,541,170 B2 | 4/2003 | Fukuda et al. |
| 6,541,376 B2 | 4/2003 | Inada et al. |
| 6,550,988 B2 | 4/2003 | Sugimoto et al. |
| 6,551,400 B2 | 4/2003 | Hasbe et al. |
| 6,551,448 B2 | 4/2003 | Kuga et al. |
| 6,556,893 B2 | 4/2003 | Kumar et al. |
| 6,558,053 B2 | 5/2003 | Shigemori et al. |
| 6,568,847 B2 | 5/2003 | Nishijima et al. |
| 6,571,147 B1 | 5/2003 | Kashihara |
| 6,573,031 B2 | 6/2003 | Shinya et al. |
| 6,575,177 B1 | 6/2003 | Brown et al. |
| 6,578,772 B2 | 6/2003 | Fujimoto et al. |
| 6,579,370 B2 | 6/2003 | Kimura et al. |
| 6,579,730 B2 | 6/2003 | Kimura et al. |
| 6,579,733 B1 | 6/2003 | Rangarajan et al. |
| 6,589,339 B2 | 7/2003 | Takeshita et al. |
| 6,598,805 B2 | 7/2003 | Sakai et al. |
| 6,599,366 B1 | 7/2003 | Kitano et al. |
| 6,602,382 B1 | 8/2003 | Matsuyama et al. |
| 6,605,153 B2 | 8/2003 | Kitano et al. |
| 6,614,201 B2 | 9/2003 | Saino et al. |
| 6,616,394 B1 | 9/2003 | Park |
| 6,616,760 B2 | 9/2003 | Kitano et al. |
| 6,616,762 B2 | 9/2003 | Inada et al. |
| 6,617,095 B2 | 9/2003 | Kitano et al. |
| 6,618,645 B2 | 9/2003 | Bacchi et al. |
| 6,620,244 B2 | 9/2003 | Yoshihara |
| 6,620,245 B2 | 9/2003 | Ishida et al. |
| 6,620,251 B2 | 9/2003 | Kitano et al. |
| 6,627,263 B2 | 9/2003 | Kitano et al. |
| 6,633,022 B2 | 10/2003 | Kitano et al. |
| 6,634,806 B2 | 10/2003 | Toshima et al. |
| 6,635,113 B2 | 10/2003 | Takamori et al. |
| 6,644,965 B2 | 11/2003 | Ookura et al. |
| 6,645,880 B1 | 11/2003 | Shigemori et al. |
| 6,654,668 B1 | 11/2003 | Harada et al. |
| 6,656,277 B2 | 12/2003 | Sanada et al. |
| 6,656,281 B1 | 12/2003 | Ueda et al. |
| 6,659,661 B2 | 12/2003 | Deguchi et al. |
| 6,662,466 B2 | 12/2003 | Gurer et al. |
| 6,669,782 B1 | 12/2003 | Thakur |
| 6,669,808 B2 | 12/2003 | Adachi et al. |
| 6,672,779 B2 | 1/2004 | Ueda et al. |
| 6,673,151 B2 | 1/2004 | Yoshihara et al. |
| 6,676,757 B2 | 1/2004 | Kitano et al. |
| 6,678,572 B1 | 1/2004 | Oh |
| 6,678,581 B2 | 1/2004 | Hung et al. |
| 6,683,006 B2 | 1/2004 | Konishi et al. |
| 6,685,422 B2 | 2/2004 | Sundar et al. |
| 6,686,571 B2 | 2/2004 | Ookura et al. |
| 6,689,215 B2 | 2/2004 | Nguyen |
| 6,691,430 B2 | 2/2004 | Saito et al. |
| 6,692,165 B2 | 2/2004 | Tanaka et al. |
| 6,692,219 B2 | 2/2004 | Coomer et al. |
| 6,694,218 B2 | 2/2004 | Oh |
| 6,694,224 B2 | 2/2004 | Ramanan |
| 6,695,922 B2 | 2/2004 | Kitano et al. |
| 6,703,316 B2 | 3/2004 | Inoue et al. |
| 6,706,321 B2 | 3/2004 | Nishiya et al. |
| 6,709,174 B2 | 3/2004 | Yamamoto et al. |
| 6,709,523 B1 | 3/2004 | Toshima et al. |
| 6,712,579 B2 | 3/2004 | Fujii et al. |
| 6,713,120 B2 | 3/2004 | Fukuda et al. |
| 6,713,239 B2 | 3/2004 | Toshima et al. |
| 6,715,943 B2 | 4/2004 | Nagamine |
| 6,716,478 B2 | 4/2004 | Kitano et al. |
| 6,726,771 B2 | 4/2004 | Ueda |
| 6,729,462 B2 | 5/2004 | Babbs et al. |
| 6,730,599 B2 | 5/2004 | Inada et al. |
| 6,736,556 B2 | 5/2004 | Kanagawa et al. |
| 6,744,020 B2 | 6/2004 | Shirakawa et al. |
| 6,749,351 B2 | 6/2004 | Sanada et al. |
| 6,749,688 B2 | 6/2004 | Tateyama et al. |
| 6,752,543 B2 | 6/2004 | Fukutomi et al. |
| 6,752,544 B2 | 6/2004 | Sanada et al. |
| 6,752,585 B2 | 6/2004 | Reimer et al. |
| 6,752,872 B2 | 6/2004 | Inada et al. |
| 6,753,508 B2 | 6/2004 | Shirakawa |
| 6,761,125 B2 | 7/2004 | Kitano et al. |
| 6,768,930 B2 | 7/2004 | Oh |
| 6,770,424 B2 | 8/2004 | Mandal et al. |
| 6,773,510 B2 | 8/2004 | Kitano et al. |
| 6,775,456 B2 | 8/2004 | Matsuura |
| 6,780,461 B2 | 8/2004 | Gurer et al. |
| 6,780,795 B2 | 8/2004 | Suzuki et al. |
| 6,790,283 B2 | 9/2004 | Hayashi et al. |
| 6,790,286 B2 | 9/2004 | Nishimura et al. |
| 6,790,287 B2 | 9/2004 | Shiga et al. |
| 6,790,291 B2 | 9/2004 | Kimura |
| 6,793,769 B2 | 9/2004 | Kajino et al. |
| 6,796,054 B2 | 9/2004 | Minami et al. |
| 6,805,769 B2 | 10/2004 | Okuda et al. |
| 6,807,452 B2 | 10/2004 | Mukuta et al. |
| 6,807,455 B2 | 10/2004 | Yoshida et al. |
| 6,808,566 B2 | 10/2004 | Kitano et al. |
| 6,809,036 B2 | 10/2004 | Liu |
| 6,811,613 B2 | 11/2004 | Kitano et al. |
| 6,811,962 B2 | 11/2004 | Yoshihara et al. |
| 6,814,507 B2 | 11/2004 | Inagaki |
| 6,814,809 B2 | 11/2004 | Matsushita et al. |
| 6,815,647 B2 | 11/2004 | Tanoue et al. |
| 6,817,790 B2 | 11/2004 | Toshima et al. |
| 6,821,550 B2 | 11/2004 | Deguchi et al. |
| 6,822,413 B2 | 11/2004 | Simondet et al. |
| 6,823,880 B2 | 11/2004 | Sakashita et al. |
| 6,824,616 B2 | 11/2004 | Kitano et al. |
| 6,826,214 B2 | 11/2004 | Nomoto |
| 6,827,782 B2 | 12/2004 | Goto et al. |
| 6,830,774 B2 | 12/2004 | Hayashi et al. |
| 6,832,863 B2 | 12/2004 | Sugimoto et al. |
| 6,834,210 B2 | 12/2004 | Tateyama et al. |
| 6,837,631 B2 | 1/2005 | Nakano et al. |
| 6,837,632 B2 | 1/2005 | Koyama et al. |
| 6,841,031 B2 | 1/2005 | Iwata et al. |
| 6,841,342 B2 | 1/2005 | Nishi et al. |
| 6,843,259 B2 | 1/2005 | Nagamine |
| 6,846,149 B2 | 1/2005 | Savage et al. |
| 6,848,625 B2 | 2/2005 | Takekuma et al. |
| 6,851,872 B1 | 2/2005 | Okubo et al. |
| 6,852,194 B2 | 2/2005 | Matsushita et al. |
| 6,860,945 B2 | 3/2005 | Kobayashi et al. |
| 6,868,888 B2 | 3/2005 | Adachi |
| 6,869,234 B2 | 3/2005 | Sanada et al. |
| 6,869,640 B2 | 3/2005 | Yoshihara et al. |
| 6,872,256 B2 | 3/2005 | Kitano et al. |
| 6,874,513 B2 | 4/2005 | Yamagata et al. |
| 6,878,216 B2 | 4/2005 | Fujishima |
| 6,878,303 B2 | 4/2005 | Okamoto |
| 6,878,401 B2 | 4/2005 | Nishijima et al. |
| 6,878,501 B2 | 4/2005 | Hatakeyama et al. |
| 6,884,294 B2 | 4/2005 | Minami et al. |

| | | | |
|---|---|---|---|
| 6,885,467 B2 | 4/2005 | Du-Nour et al. | |
| 6,889,105 B2 | 5/2005 | Mukuta et al. | |
| 6,893,171 B2 | 5/2005 | Fukutomi et al. | |
| 6,893,513 B2 | 5/2005 | Michaluk et al. | |
| 6,893,805 B2 | 5/2005 | Iseki et al. | |
| 6,896,466 B2 | 5/2005 | Nishimura et al. | |
| 6,991,710 B2 | 1/2006 | Harris et al. | |
| 7,053,386 B1 | 5/2006 | Holtam et al. | |
| 7,100,954 B2 | 9/2006 | Klein et al. | |
| 7,125,059 B2 | 10/2006 | Miyamoto | |
| 7,279,067 B2 | 10/2007 | Yoshida et al. | |
| 2001/0024691 A1 | 9/2001 | Kimura et al. | |
| 2002/0098072 A1 | 7/2002 | Sundar | |
| 2003/0010449 A1 | 1/2003 | Gramarossa et al. | |
| 2003/0044261 A1 | 3/2003 | Bonora et al. | |
| 2003/0052497 A1 | 3/2003 | Holbrooks | |
| 2003/0052498 A1 | 3/2003 | Holbrooks | |
| 2003/0151268 A1 | 8/2003 | Holbrooks | |
| 2004/0020601 A1 | 2/2004 | Zhao et al. | |
| 2004/0091349 A1 | 5/2004 | Tabrizie et al. | |
| 2005/0095088 A1 | 5/2005 | Kurita et al. | |
| 2006/0045719 A1 | 3/2006 | Bacchi et al. | |
| 2006/0134330 A1 | 6/2006 | Ishikawa et al. | |
| 2006/0165408 A1 | 7/2006 | Akimoto et al. | |
| 2006/0182536 A1 | 8/2006 | Rice et al. | |

FOREIGN PATENT DOCUMENTS

| | | |
|---|---|---|
| EP | 1 114 882 A | 7/2001 |
| JP | 51004311 | 1/1976 |
| JP | 07235473 | 9/1995 |
| JP | 10006757 | 1/1998 |
| JP | 11279797 | 10/1999 |
| TW | 501169 | 9/2002 |
| TW | 516072 | 1/2003 |
| WO | WO 00/12958 | 3/2000 |

OTHER PUBLICATIONS

First Office Action for Chinese Patent Application No. 200680013355.8 dated Apr. 24, 2009.
Non-Final Office Action dated Jun. 11, 2009 for U.S. Appl. No. 11/553,820.
USPTO Office Action dated Feb. 3, 2009, in U.S. Appl. No. 11/315,778.
Response to Office Action filed Jun. 3, 2009, in U.S. Appl. No. 11/315,778.
USPTO Final Office Action dated Aug. 5, 2009, in U.S. Appl. No. 11/315,778.
USPTO Office Action dated Jul. 22, 2009, in U.S. Appl. No. 11/458,664.
Response to Office Action filed Oct. 14, 2008, in U.S. Appl. No. 11/458,664.
USPTO Final Office Action dated Jan. 27, 2009, in U.S. Appl. No. 11/458,664.
Response to Final Office Action filed Mar. 31, 2009, in U.S. Appl. No. 11/458,664.
USPTO Office Action dated Jun. 23, 2009, in U.S. Appl. No. 11/458,664.
USPTO Office Action dated May 12, 2008, in U.S. Appl. No. 11/553,820.
Response to Office Action filed Aug. 12, 2008, in U.S. Appl. No. 11/553,820.
USPTO Final Office Action dated Nov. 28, 2008, in U.S. Appl. No. 11/553,820.
Response to Final Office Action filed Jan. 27, 2009, in U.S. Appl. No. 11/553,820.
Second Response to Final Office Action filed Feb. 26, 2009, in U.S. Appl. No. 11/553,820.
USPTO Advisory Action dated Mar. 6, 2009, in U.S. Appl. No. 11/553,820.
Supplemental Response to Final Office Action filed Mar. 30, 2009, in U.S. Appl. No. 11/553,820.
USPTO Office Action dated Jun. 11, 2009, in U.S. Appl. No. 11/553,820.
USPTO Office Action dated May 15, 2008, in U.S. Appl. No. 11/315,984.
Response to Office Action filed Jul. 10, 2008, in U.S. Appl. No. 11/315,984.
USPTO Final Office Action dated Jul. 6, 2009, in U.S. Appl. No. 11/315,984.
First Office Action dated Aug. 24, 2009, in Korean Patent Application No. 10-2007-7025316.
Response to Office Action filed Aug. 27, 2009, in U.S. Appl. No. 11/458,664.
Eberhardt et al., entitled: "Advanced Photoresist Wafer Processing System for Deep UV (DUV)" Fairchild Technologies, GMBH pp. 1-10.

* cited by examiner

| | | | | | |
|---|---|---|---|---|---|
| CD4 | 160 | CD8 | 800 | BC18 | 800 | BC6 | 801 | PEBC6 |
| | | | 800 | BC17 | 800 | BC5 | 801 | PEBC5 |
| CD3 | 160 | CD7 | 800 | BC16 | 800 | BC4 | 801 | PEBC4 |
| | | | 800 | BC15 | 800 | BC3 | 801 | PEBC3 |
| CD2 | 160 | CD6 | 800 | BC14 | 800 | BC2 | 801 | PEBC2 |
| | | | 800 | BC13 | 800 | BC1 | 801 | PEBC1 |
| CD1 | 160 | CD5 | 800 | BC12 | 180 | C6 | 165 | S6 |
| | | | 800 | BC11 | 180 | C5 | 165 | S5 |
| | | | 800 | BC10 | 180 | C4 | 165 | S4 |
| | | | 800 | BC9 | 180 | C3 | 165 | S3 |
| | | | 800 | BC8 | 180 | C2 | 165 | S2 |
| | | | 800 | BC7 | 180 | C1 | 165 | S1 |

CARTESIAN CLUSTER TOOL CONFIGURATION FOR LITHOGRAPHY TYPE PROCESSES

CROSS-REFERENCE TO RELATED APPLICATIONS

This application is a continuation-in-part of U.S. patent application Ser. No. 11/315,984, filed Dec. 22, 2005 now U.S. Pat. No. 7,651,306, which is herein incorporated by reference.

This application is also related to U.S. patent application Ser. No. 11/458,667, filed Aug. 19, 2006, U.S. patent application Ser. No. 11/112,281, filed Apr. 22, 2005, U.S. patent application Ser. No. 11/112,932, filed Apr. 22, 2005, U.S. Provisional Patent Application Ser. No. 60/673,848, filed Apr. 22, 2005, and U.S. Provisional Patent Application Ser. No. 60/639,109, filed Dec. 22, 2004.

BACKGROUND OF THE INVENTION

1. Field of the Invention

Embodiments of the invention generally relate to an integrated processing system containing multiple processing stations and robots that are capable of processing multiple substrates in parallel.

2. Description of the Related Art

The process of forming electronic devices is commonly done in a multi-chamber processing system (e.g., a cluster tool) that has the capability to sequentially process substrates, (e.g., semiconductor wafers) in a controlled processing environment. Typical cluster tools used to deposit (i.e., coat) and develop a photoresist material, commonly known as a track lithography tool, or used to perform semiconductor cleaning processes, commonly described as a wet/clean tool, will include a mainframe that houses at least one substrate transfer robot which transports substrates between a pod/cassette mounting device and multiple processing chambers that are connected to the mainframe. Cluster tools are often used so that substrates can be processed in a repeatable way in a controlled processing environment. A controlled processing environment has many benefits which include minimizing contamination of the substrate surfaces during transfer and during completion of the various substrate processing steps. Processing in a controlled environment thus reduces the number of generated defects and improves device yield.

The effectiveness of a substrate fabrication process is often measured by two related and important factors, which are device yield and the cost of ownership (CoO). These factors are important since they directly affect the cost to produce an electronic device and thus a device manufacturer's competitiveness in the market place. The CoO, while affected by a number of factors, is greatly affected by the system and chamber throughput, or simply the number of substrates per hour processed using a desired processing sequence. A process sequence is generally defined as the sequence of device fabrication steps, or process recipe steps, completed in one or more processing chambers in the cluster tool. A process sequence may generally contain various substrate (or wafer) electronic device fabrication processing steps. In an effort to reduce CoO, electronic device manufacturers often spend a large amount of time trying to optimize the process sequence and chamber processing time to achieve the greatest substrate throughput possible given the cluster tool architecture limitations and the chamber processing times.

In track lithography type cluster tools, since the chamber processing times tend to be rather short, (e.g., about a minute to complete the process) and the number of processing steps required to complete a typical process sequence is large, a significant portion of the time it takes to complete the processing sequence is taken up transferring the substrates between the various processing chambers. A typical track lithography process sequence will generally include the following steps: depositing one or more uniform photoresist (or resist) layers on the surface of a substrate, then transferring the substrate out of the cluster tool to a separate stepper or scanner tool to pattern the substrate surface by exposing the photoresist layer to a photoresist modifying electromagnetic radiation, and then developing the patterned photoresist layer. If the substrate throughput in a cluster tool is not robot limited, the longest process recipe step will generally limit the throughput of the processing sequence. This is usually not the case in track lithography process sequences, due to the short processing times and large number of processing steps. Typical system throughput for the conventional fabrication processes, such as a track lithography tool running a typical process, will generally be between 100-120 substrates per hour.

Other important factors in the CoO calculation are the system reliability and system uptime. These factors are very important to a cluster tool's profitability and/or usefulness, since the longer the system is unable to process substrates the more money is lost by the user due to the lost opportunity to process substrates in the cluster tool. Therefore, cluster tool users and manufacturers spend a large amount of time trying to develop reliable processes, reliable hardware and reliable systems that have increased uptime.

FIG. 1 illustrates a top view of a conventional cluster tool configuration (e.g., cluster tool 22) that contains three processing cells 16 that each contain a robot 17, one or more pass-through slots 21 (e.g., robots 21A-21C), and one or more processing chambers 18 that surround each of the robots 17 (e.g., robots 17A-17C). The cluster tool 22 will also generally contain a front end unit 19 that contains a front end robot 20 and one or more substrate cassettes 23. In these type of conventional cluster tool configurations the size and number of processing chambers 18 are limited by the reach of the robots 17A-C and thus can not be increased in size unless another processing cell (e.g., item #16') is added to the cluster tool. When a new processing cell 16' is added, a new robot has to be added to the cluster tool 22 so that substrates can be transferred to the added processing chambers 18. The process of transferring substrates through the cluster tool 22 needs to be done "serially", rather than in parallel, since each substrate must be transferred from one processing cell 16 to another by use of the robot positioned in the center of each cell. An issue arises since the reliability of a serial sequence is proportional to the product of the reliability of each component in the sequence. Therefore, by adding additional robots to the cluster tool the reliability of the system will drop. For example, a transferring sequence that uses two robots that have an uptime of 99% each, will limit the system's uptime to 98.01%, whereas a system that was able to utilize a single robot to service the same number of chambers would have an uptime of 99%. Therefore, since system uptime is a major factor in CoO calculations there is a need for a cluster tool that minimizes the number of serial steps and serial components.

Prior art configurations, such as the one shown in FIG. 1, require the use of multiple pass-through slots 21 distributed throughout the cluster tool 22, and multiple robots to complete the transferring process sequence through the cluster tool. For example, a first robot 17A will handoff each substrate to a pass-through slot 21B so that the adjacent second robot 17B can pickup and transfer the substrate to a desired position within a processing chamber in its processing cell 16. After the substrate is processed in the processing chamber the substrate is then placed back in the pass-through slot 21B by the second robot 17B where it is picked up by the first robot 17A. Conventional cluster tool transferring sequences that require multiple handoffs to pass-through chambers are detrimental to CoO calculations, since it requires a number of non-value added moves to transfer the substrate between various processing cells 16 within the cluster tool 21. The non-value added moves can be costly due to decreased substrate throughput and the decrease in the cluster tool reliability. Since track lithography chamber processing times tend to be rather short, and the number of processing steps required to complete a typical process sequence is large, the system throughput can be significantly affected by the number of wafer handoffs, the non-value added moves of a robot, and the reliability of the components within the system. Therefore, there is a need for a cluster tool that reduces the number of non-value added moves, such as pass-through steps.

Another issue that arises when building a cluster tool that have a large number of processing chambers and supporting components, which are common to lithography type cluster tools, is that the cluster tool is hard to manufacture, the cluster tool is not easily serviced during operation, and the cluster tool is not easily configured to meet the end user's needs. These issues commonly arise due to the competing goals that require the footprint of the cluster tool to be as small as possible versus the cluster tool having enough chambers and robotic components to assure that the throughput of the system achieves a desired goal. Therefore, there is a need for a cluster tool that is easy to manufacture, is easy to service, is easily configured, and has a small footprint relative to the prior art type configurations.

The push in the industry to shrink the size of semiconductor devices to improve device processing speed and reduce the generation of heat by the device, has reduced the industry's tolerance for process variability. To minimize process variability an important factor in the track lithography processing sequences is the issue of assuring that every substrate run through a cluster tool has the same "wafer history." A substrate's wafer history is generally monitored and controlled by process engineers to assure that all of the device fabrication processing variables that may later affect a device's performance are controlled, so that all substrates in the same batch are always processed the same way. To assure that each substrate has the same "wafer history" requires that each substrate experiences the same repeatable substrate processing steps (e.g., consistent coating process, consistent hard bake process, consistent chill process, etc.) and the timing between the various processing steps is the same for each substrate. Lithography type device fabrication processes can be especially sensitive to variations in process recipe variables and the timing between the recipe steps, which directly affects process variability and ultimately device performance. Therefore, a cluster tool and supporting apparatus capable of performing a process sequence that minimizes process variability and the variability in the timing between process steps is needed. Also, a cluster tool and supporting apparatus that is capable of performing a device fabrication process that delivers a uniform and repeatable process result, while achieving a desired substrate throughput is also needed.

Therefore, there is a need for a system, a method and an apparatus that can process a substrate so that it can meet the required device performance goals and increase the system throughput and thus reduce the process sequence CoO.

SUMMARY OF THE INVENTION

The present invention generally provide a cluster tool for processing a substrate, comprising a first processing rack comprising a first group of two or more process chambers that are stacked vertically and a second group of two or more process chambers that are stacked vertically, wherein the each substrate processing chamber in the first and second groups has a first side that is aligned along a first direction that is generally perpendicular to the vertical direction, a second processing rack comprising a third group of two or more process chambers that are stacked vertically and a fourth group of two or more process chambers that are stacked vertically, wherein the each substrate processing chamber in the third and fourth groups has a first side that is aligned along the first direction, a first robot assembly adapted to translate in a direction parallel to the first direction and position a substrate in each of the substrate processing chambers in the first processing rack, a second robot assembly adapted to translate in a direction parallel to the first direction and position a substrate in each of the substrate processing chambers in the second processing rack, a third robot assembly that is in communication with a process chamber in the first processing rack and a first processing module in an interface assembly, a fourth robot assembly that is in communication with a process chamber in the second processing rack and a second processing module in the interface assembly, and a fifth robot assembly that is positioned within the interface assembly and is in communication with the first processing module and the second processing module, wherein the fifth robot assembly is adapted to communicate with an external module in the interface assembly.

Embodiments of the invention further provide a cluster tool for processing a substrate, comprising a first processing rack comprising a first group of two or more process chambers that are stacked vertically and a second group of two or more process chambers that are stacked vertically, wherein the two or more substrate processing chambers in the first and second groups have a first side that is aligned along a first direction, a second processing rack comprising a third group of two or more process chambers that are stacked vertically and a fourth group of two or more process chambers that are stacked vertically, wherein the two or more substrate processing chambers in the third and fourth groups have a first side that is aligned along the first direction, a first robot assembly adapted to transfer a substrate to the substrate processing chambers in the first processing rack, wherein the first robot assembly comprises a first robot having a robot blade and a substrate receiving surface located thereon, wherein the first robot defines a transferring region and is adapted to position a substrate at one or more points generally contained within a first plane, wherein the first plane is parallel to the first direction and a second direction which is orthogonal to the first direction, a first motion assembly that is adapted to position the first robot in a third direction that is generally perpendicular to the first plane, and a second motion assembly that is adapted to position the first robot in a direction generally parallel to the first direction, a second robot assembly adapted to transfer a substrate to the substrate processing chambers in the second processing rack, wherein the second robot assembly comprises a second robot having a robot blade and a substrate receiving surface located thereon, wherein the second robot defines a transferring region and is adapted to position a substrate at one or more points generally contained within the first plane, wherein the first plane is parallel to the first direction and the second direction which is orthogonal to the first direction, a third motion assembly that is adapted to position the second robot in a third direction that is generally perpendicular to the first plane, and a fourth motion assembly that is adapted to position the second robot in a direction generally parallel to the first direction, a third robot assembly that is in communication with a process chamber in the first processing rack and a first processing module in an interface assembly which is positioned adjacent to the first processing rack, a fourth robot assembly that is in communication with a process chamber in the second processing rack and a second processing module in the interface assembly which is positioned adjacent to the second processing rack, and a fifth robot assembly that is positioned within the interface assembly and is in communication with the first processing module and the second processing module, wherein the fifth robot assembly is adapted to communicate with an external module in the interface assembly.

Embodiments of the invention further provide a cluster tool for processing a substrate, comprising a first processing rack comprising a first group of two or more process chambers that are stacked vertically and each process chamber has a first width aligned along a first direction, and a second group of two or more process chambers that are stacked vertically and each process chamber has a second width aligned along a first direction, wherein the first direction is generally perpendicular to the vertical direction and the second width is generally a multiple of the first width, and a first robot assembly adapted to translate in a direction parallel to the first direction and position a substrate in each of the substrate processing chambers in the first processing rack.

Embodiments of the invention further provide a cluster tool for processing a substrate, comprising a first processing rack comprising a first group of two or more process chambers that are stacked vertically, and a second group of two or more process chambers that are stacked vertically, wherein the two or more substrate processing chambers in the first and second groups have a first side that is aligned along a first direction, a second processing rack comprising a third group of two or more process chambers that are stacked vertically, and a fourth group of two or more process chambers that are stacked vertically, wherein the two or more substrate processing chambers in the third and fourth groups have a first side that is aligned along a first direction, a first robot assembly adapted to transfer a substrate to the substrate processing chambers in the first processing rack, wherein the first robot assembly is contained within a central module and comprises a first robot having a robot blade and a substrate receiving surface located thereon, wherein the first robot defines a transferring region and is adapted to position a substrate at one or more points generally contained within a first plane, wherein the first plane is parallel to the first direction and a second direction which is orthogonal to the first direction, a first motion assembly that is adapted to position the first robot in a third direction that is generally perpendicular to the first plane, and a second motion assembly that is adapted to position the first robot in a direction generally parallel to the first direction, a second robot assembly adapted to transfer a substrate to the substrate processing chambers in the second processing rack, wherein the second robot assembly is contained within a central module and comprises a second robot having a robot blade and a substrate receiving surface located thereon, wherein the second robot defines a transferring region and is adapted to position a substrate at one or more points generally contained within a first plane, wherein the first plane is parallel to the first direction and a second direction which is orthogonal to the first direction, a third motion assembly that is adapted to position the second robot in a third direction that is generally perpendicular to the first plane, and a fourth motion assembly that is adapted to position the second robot in a direction generally parallel to the first direction, a front-end robot positioned in an interface assembly that is positioned adjacent to the first and second processing racks, wherein the front-end robot is adapted to transfer a substrate to and from a cassette that is in communication with the interface assembly, and a pass-through chamber positioned proximate to the central module and the interface assembly and is adapted to receive a substrate from the front-end robot, the first robot assembly and the second robot assembly.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2F is a side view that illustrates one embodiment of the second processing rack assembly 80 according to the present invention;

DETAILED DESCRIPTION

Figure 1:
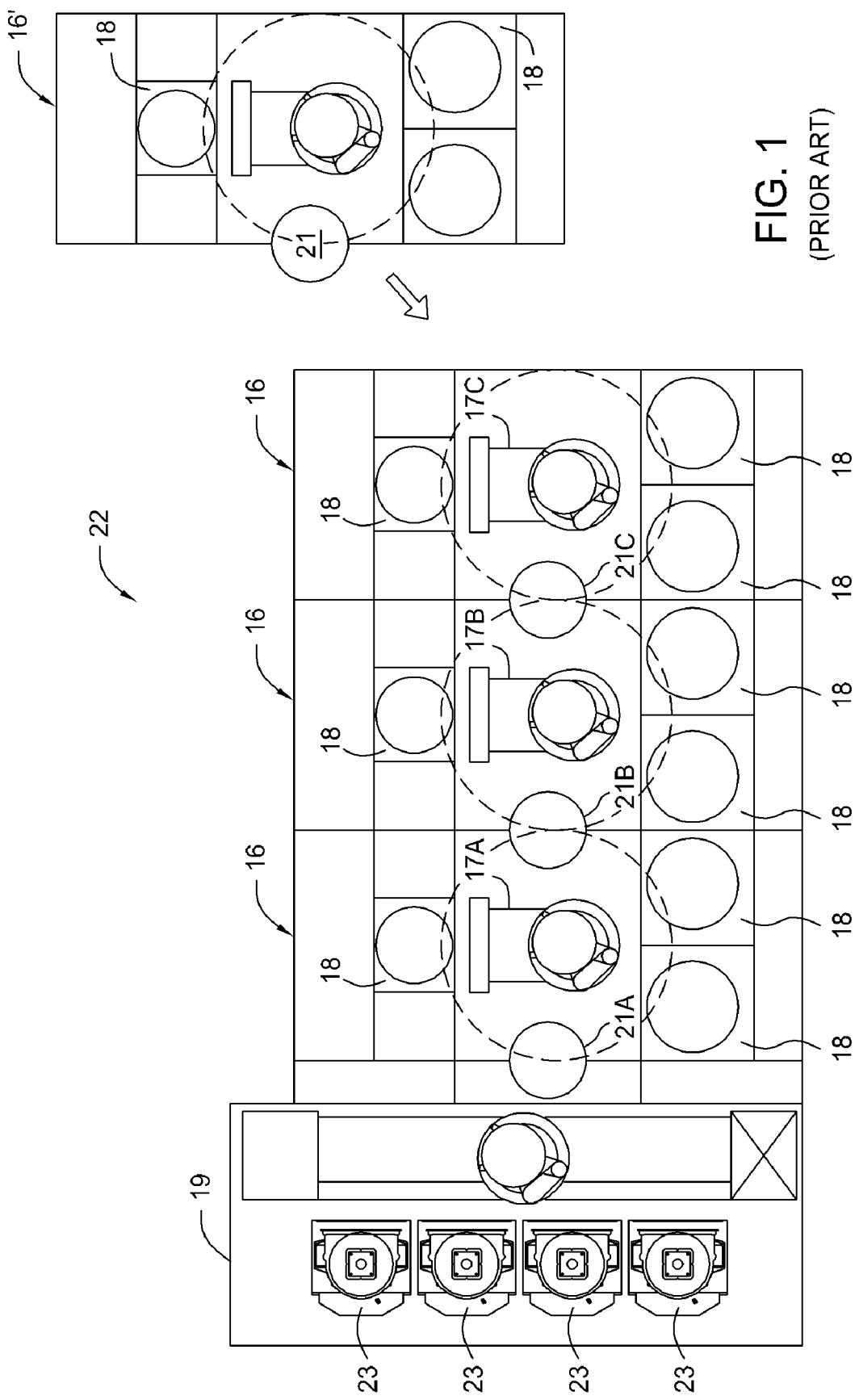
FIG. 1 (Prior Art) is a plan view illustrating a conventional cluster tool configuration.

The present invention generally provides an apparatus and method for processing substrates using a multi-chamber processing system (e.g., a cluster tool) that is easily configurable, has an increased system throughput, increased system reliability, improved device yield performance, a more repeatable wafer processing history (or wafer history), and a reduced footprint. In one embodiment, the cluster tool is adapted to perform a track lithography process in which a substrate is coated with a photosensitive material, is then transferred to a stepper/scanner, which exposes the photosensitive material to some form of radiation to form a pattern in the photosensitive material, and then certain portions of the photosensitive material are removed in a developing process completed in the cluster tool.

FIGS. 2-7 illustrate some of the various robot and process chamber configurations that may be used in conjunction with various embodiments of this invention. The various embodiments of the cluster tool 10 generally utilize two or more robots that are configured in a parallel processing configuration to transfer substrates between the various processing chambers retained in the processing racks (e.g., elements 60, 80, etc.) so that a desired processing sequence can be performed on the substrates. In one embodiment, the parallel processing configuration contains two or more robot assemblies 11 (elements 11A, 11B in FIGS. 2A and 2B) that are adapted to move a substrate in a vertical (hereafter the z-direction) and horizontal directions, i.e., transfer direction (x-direction) and a direction orthogonal to the transfer direction (y-direction), so that the substrates can be processed in various processing chambers retained in the processing racks (e.g., elements 60 and 80) which are aligned along the transfer direction. One advantage of the parallel processing configuration is that if one of the robots becomes inoperable, or is taken down for servicing, the system can still continue to process substrates using the other robots retained in the system. Generally, the various embodiments described herein are advantageous since each row or group of substrate processing chambers are serviced by two or more robots to allow for increased throughput and increased system reliability. Also, the various embodiments described herein are generally configured to minimize and control the particles generated by the substrate transferring mechanisms, to prevent device yield and substrate scrap problems that can affect the CoO of the cluster tool. Another advantage of this configuration is the flexible and modular architecture allows the user to configure the number of processing chambers, processing racks, and processing robots required to meet the throughput needs of the user. While FIGS. 2-7 illustrate one embodiment of a robot assembly 11 that can be used to carryout various aspects of the invention, other types of robot assemblies 11 may be adapted to perform the same substrate transferring and positioning function(s) without varying from the basic scope of the invention.

First Cluster Tool Configuration

A. System Configuration

Figure 2A:
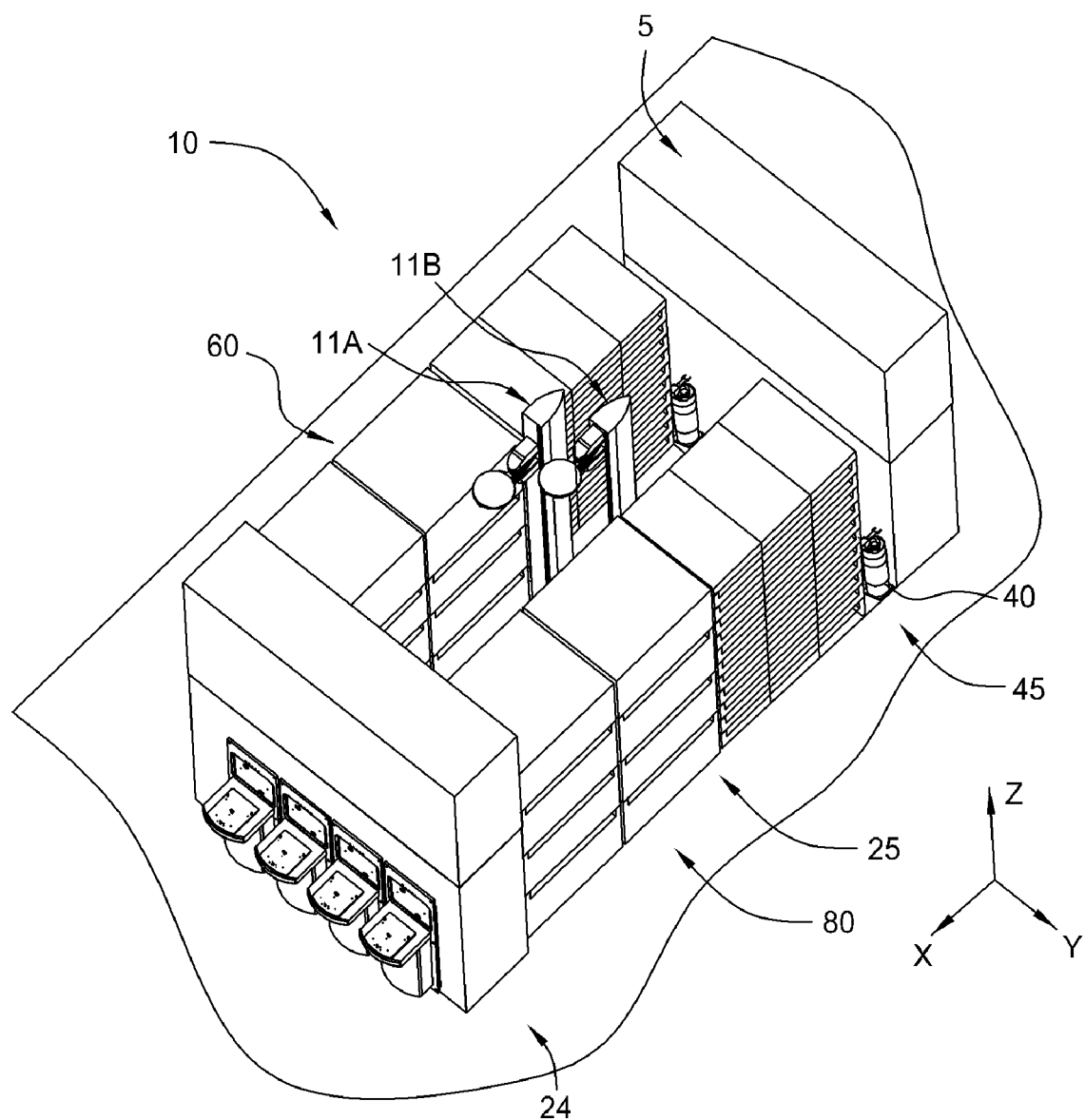
FIG. 2A is an isometric view illustrating one embodiment of a cluster tool of the invention.

FIG. 2A is an isometric view of one embodiment of a cluster tool 10 that illustrates a number of the aspects of the present invention that may be used to advantage. FIG. 2A illustrates an embodiment of the cluster tool 10 which contains two robots that are adapted to access the various process chambers that are stacked vertically in a first processing rack assembly 60 and a second processing rack assembly 80 and an external module 5. In one aspect, when the cluster tool 10 is used to complete a photolithography processing sequence the external module 5, may be a stepper/scanner tool, that is attached to the rear region 45 (not shown in FIG. 2A) to perform some additional exposure type processing step(s). One embodiment of the cluster tool 10, as illustrated in FIG. 2A, contains a front end module 24 and a central module 25.

Figure 2B:
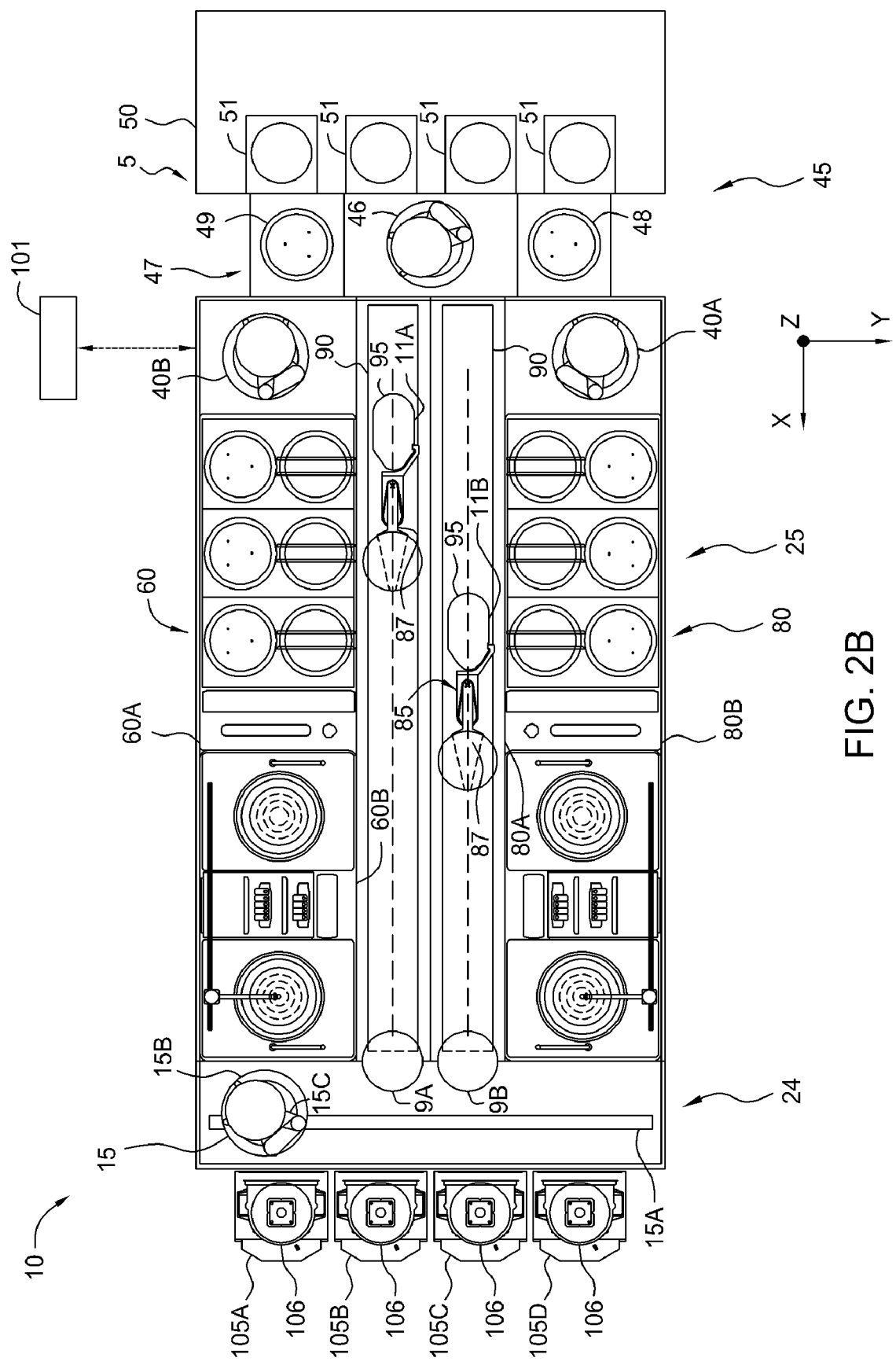
FIG. 2B is a plan view of the processing system illustrated in FIG. 2A, according to the present invention.

FIG. 2B is a plan view of the embodiment of the cluster tool 10 shown in FIG. 2A. The front end module 24 generally contains one or more pod assemblies 105 (e.g., items 105A-D) and a front end robot assembly 15. The one or more pod assemblies 105, or front-end opening unified pods (FOUPs), are generally adapted to accept one or more cassettes 106 that may contain one or more substrates "W", or wafers, that are to be processed in the cluster tool 10. In one aspect, the front end module 24 also contains one or more pass-through positions 9 (e.g., elements 9A-B FIG. 2B).

In one aspect, the central module 25 has a first robot assembly 11A, a second robot assembly 11B, a first rear robot assembly 40A, a second rear robot assembly 40B, a first stepper robot assembly 46, a first processing rack assembly 60 and a second processing rack assembly 80. The first processing rack assembly 60 and a second processing rack assembly 80 contain various processing chambers (e.g., coater/developer chamber, bake chamber, chill chamber, wet clean chambers, etc. which are discussed below (FIGS. 2C-D)) that are adapted to perform the various processing steps found in a substrate processing sequence.

Figure 2C:
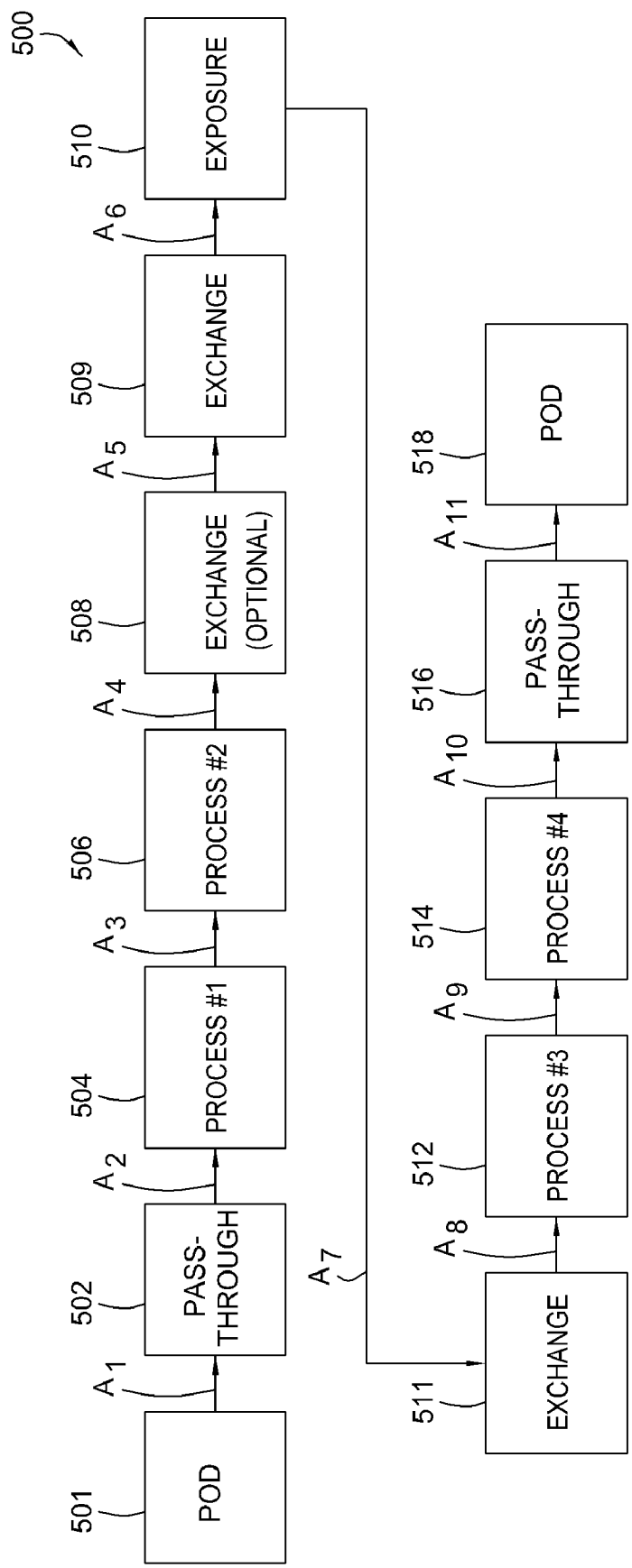
FIG. 2C illustrates one embodiment of a process sequence containing various process recipe steps that may be used in conjunction with the various embodiments of the cluster tool described herein.
Figure 2D:
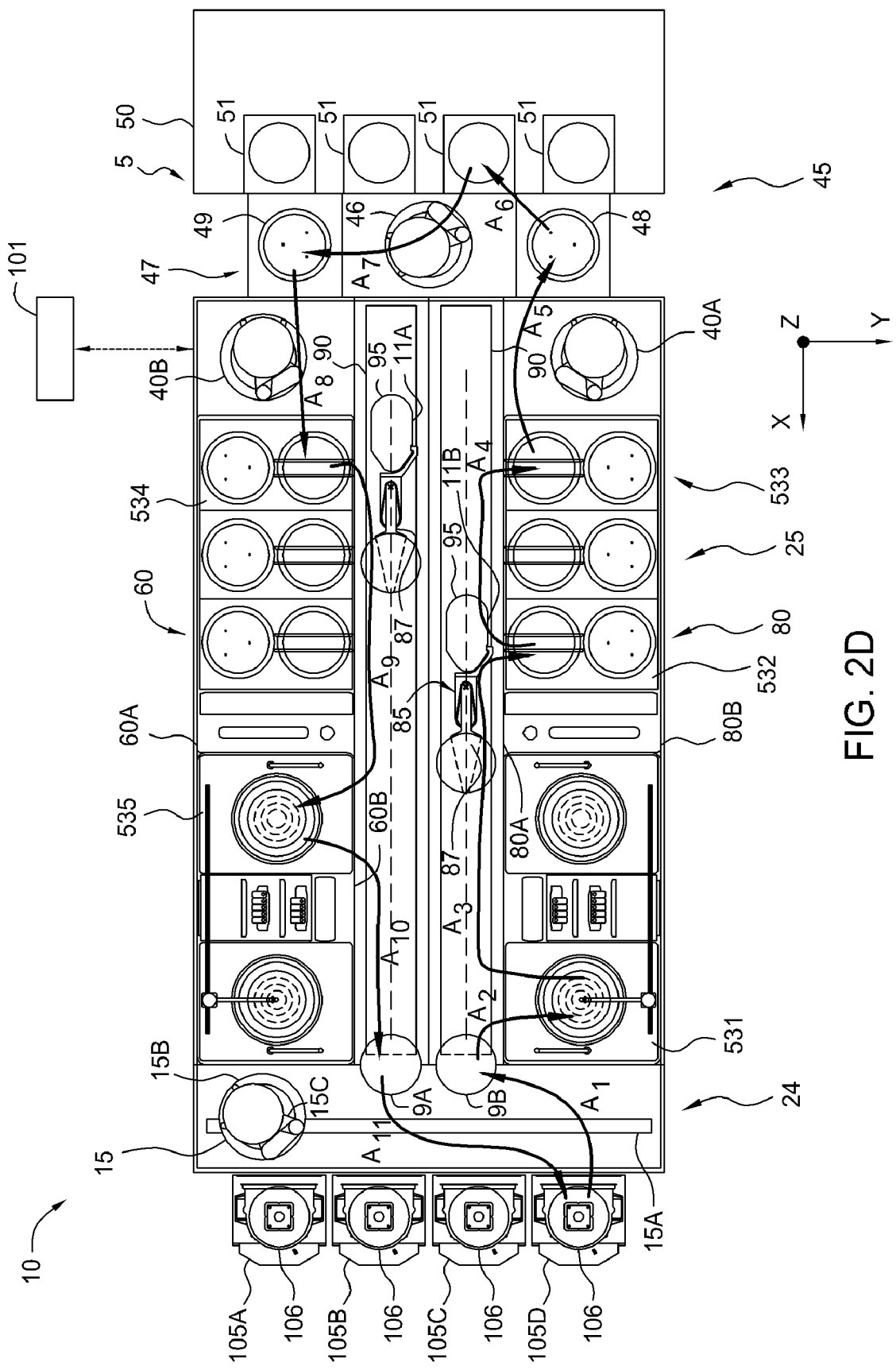
FIG. 2D is a plan view of the processing system illustrated in FIG. 2B, according to the present invention.
Figure 2E:
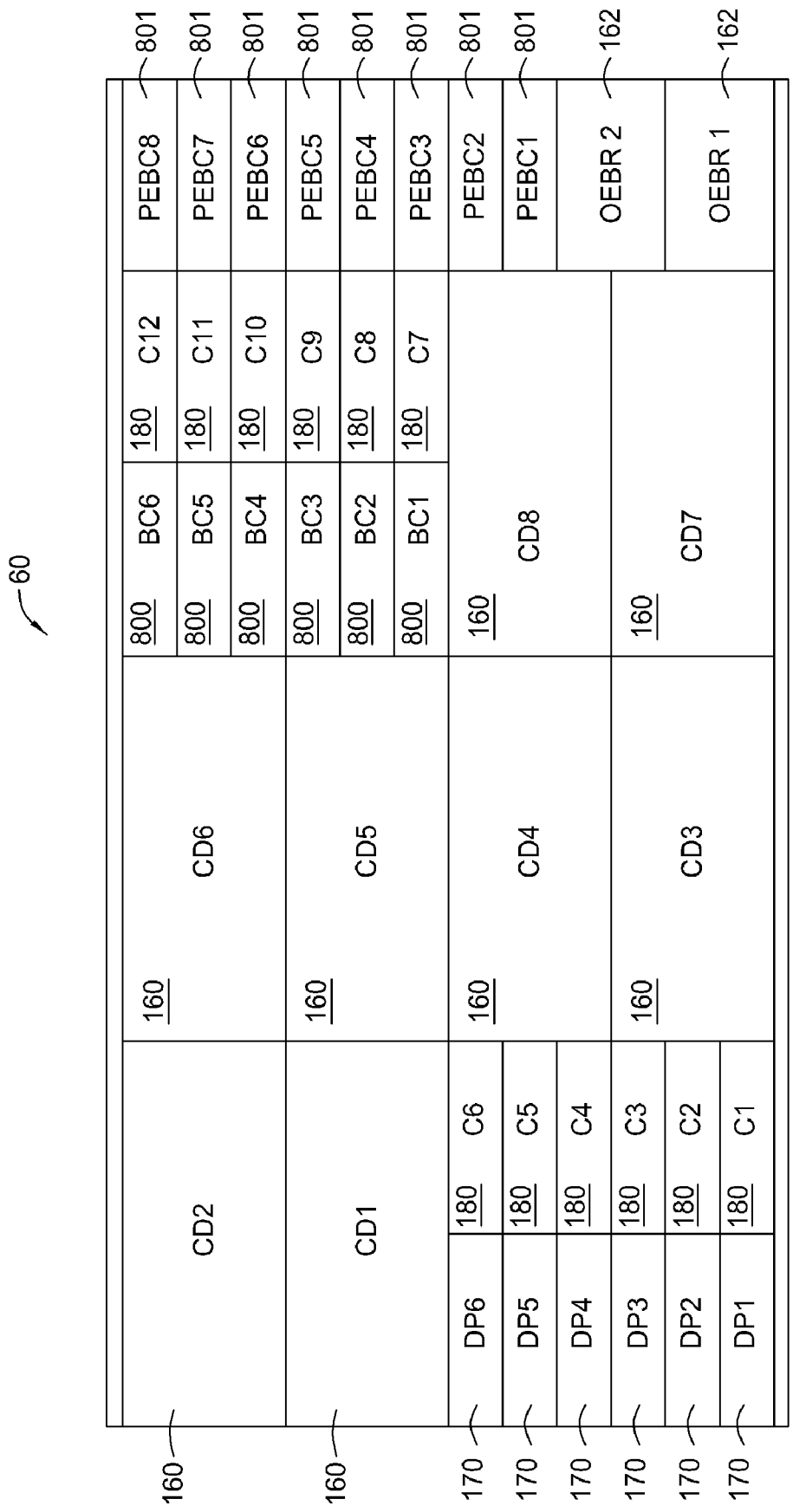
FIG. 2E is a side view that illustrates one embodiment of the first processing rack assembly 60 according to the present invention.

FIGS. 2E and 2F illustrate side views of one embodiment of the first processing rack assembly 60 and second processing rack assembly 80 as viewed when facing the first processing rack assembly 60 and second processing racks 80 while standing on the side closest to side 60A, and thus will coincide with the views shown in FIGS. 2A-2F, 4A-4B and 7. The first processing rack assembly 60 and second processing rack assembly 80 generally contain one or more groups of vertically stacked processing chambers, or individual racks that are adapted to perform some desired semiconductor or flat panel display device fabrication processing steps on a substrate. For example, in FIG. 2C the first process rack assembly 60 has five groups, or racks, containing vertically stacked processing chambers. In general these device fabrication processing steps may include depositing a material on a surface of the substrate, cleaning a surface of the substrate, etching a surface of the substrate, or exposing the substrate to some form of radiation to cause a physical or chemical change to one or more regions on the substrate. In one embodiment, the first processing rack assembly 60 and second processing rack assembly 80 have one or more processing chambers contained in them that can be adapted to perform one or more photolithography processing sequence steps. In one aspect, processing racks 60 and 80 may contain one or more coater/developer chambers 160, one or more chill chambers 180, one or more bake chambers 190, one or more optical edge bead removal (OEBR) chambers 162, one or more post exposure bake (PEB) chambers 130, one or more support chambers 165, an integrated bake/chill chamber 800, integrated PEB chambers 801 and/or one or more hexamethyldisilazane (HMDS) processing chambers 170. Exemplary coater/developer chambers, chill chambers, bake chambers, OEBR chambers, PEB chambers, support chambers, integrated bake/chill chambers and/or HMDS processing chambers that may be adapted to benefit one or more aspects of the invention are further described in the commonly assigned U.S. patent application Ser. No. 11/112,281, filed Apr. 22, 2005, which is hereby incorporated by reference in its entirety to the extent not inconsistent with the claimed invention. Examples of an integrated bake/chill chamber and an integrated PEB chamber that may be adapted to benefit one or more aspects of the invention are further described in the commonly assigned U.S. patent application Ser. No. 11/111,154, filed Apr. 11, 2005 and U.S. patent application Ser. No. 11/111,353, filed Apr. 11, 2005, which are hereby incorporated by reference in its entirety to the extent not inconsistent with the claimed invention.

In one embodiment, as shown in FIG. 2E, where the cluster tool 10 is adapted to perform a photolithography type process, the first processing rack assembly 60 may have eight coater/developer chambers 160 (labeled CD1-8), six chill chambers 180 (labeled C1-6), six integrated bake/chill chamber 800 (labeled BC1-6), eight integrated PEB chambers 801 (labeled PEBC 1-8), and two OEBR chambers 162 (labeled OEBR 1-2). In one embodiment, as shown in FIG. 2F, where the cluster tool 10 is adapted to perform a photolithography type process, the second process rack 80 may have eight coater/developer chambers 160 (labeled CD1-8), eighteen integrated bake/chill chambers 800 (labeled BC1-18), six integrated PEB chambers 801 (labeled PEBC 1-8) and six support chambers 165 (labeled S1-6). The orientation, positioning, type and number of process chambers shown in the FIGS. 2E-F are not intended to be limiting as to the scope of the invention, but are intended to illustrate an embodiment of the invention. An example of an exemplary integrated bake/chill chamber or integrated PEB chamber that may be adapted to benefit one or more aspects of the invention is further described in the commonly assigned U.S. patent application Ser. No. 11/174,781, filed Jul. 5, 2005, U.S. patent application Ser. No. 11/174,782, filed Jul. 5, 2005 and U.S. patent application Ser. No. 11/413,960, filed Apr. 28, 2006, which are all hereby incorporated by reference in its entirety to the extent not inconsistent with the claimed invention. An example of an exemplary coater/developer chamber that may be adapted to benefit one or more aspects of the invention is further described in the commonly assigned U.S. patent application Ser. No. 11/112,281, filed Apr. 22, 2005, U.S. patent application Ser. No. 11/111,353, filed Apr. 20, 2005 and U.S. patent application Ser. No. 11/111,154, filed Apr. 20, 2005, which are hereby incorporated by reference in its entirety to the extent not inconsistent with the claimed invention. An example of an exemplary bake/chill chamber that may be adapted to benefit one or more aspects of the invention is further described in the commonly assigned U.S. patent application Ser. No. 11/112,281, filed Apr. 22, 2005, which is hereby incorporated by reference in its entirety to the extent not inconsistent with the claimed invention.

Referring to FIG. 2B, in one embodiment, the front end robot assembly 15 is adapted to transfer substrates between a cassette 106 mounted in a pod assembly 105 (see elements 105A-D) and the one or more of the pass-through positions 9 (see pass-through positions 9A-B in FIG. 2B). In another embodiment, the front end robot assembly 15 is adapted to transfer substrates between a cassette mounted in a pod assembly 105 and the one or more processing chambers in the first processing rack assembly 60 or a second processing rack assembly 80 that abuts the front end module 24. The front end robot assembly 15 generally contains a horizontal motion assembly 15A and a robot 15B, which in combination are able to position a substrate in a desired horizontal and/or vertical position in the front end module 24 or the adjoining positions in the central module 25. The front end robot assembly 15 is adapted to transfer one or more substrates using one or more robot blades 15C, by use commands sent from a system controller 101 (discussed below). In one sequence the front end robot assembly 15 is adapted to transfer a substrate from the cassette 106 to one of the pass-through positions 9A-9B. Generally, a pass-through position is a substrate staging area that may contain a pass-through processing chamber that has features similar to an exchange chamber 533 (FIG. 3), or a conventional substrate cassette 106, and is able to accept a substrate from a first robot so that it can be removed and repositioned by a second robot. In one aspect, the pass-through processing chamber mounted in a pass-through position may be adapted to perform one or more processing steps in a desired processing sequence, for example, a HMDS process step or a chill/cooldown processing step or substrate notch align. In one aspect, each of the pass-through positions 9A-9B may be accessed by each of the central robot assemblies (i.e., first robot assembly 11A and second robot assembly 11B).

Referring to FIGS. 2A-B, the first robot assembly 11A and the second robot assembly 11B are adapted to transfer substrates to the various processing chambers contained in the first processing rack assembly 60 and the second processing rack assembly 80. In one embodiment, to perform the process of transferring substrates in the cluster tool 10 the first robot assembly 11A and the second robot assembly 11B have similarly configured robot assemblies 11 which each have at least one horizontal motion assembly 90, a vertical motion assembly 95, and a robot hardware assembly 85 which are in communication with a system controller 101. In one aspect, the side 60B of the first processing rack assembly 60, and the side 80A of the second processing rack assembly 80 are both aligned along a direction parallel to the horizontal motion assembly 90 (described below) of each of the various robot assemblies (i.e., first robot assembly 11A and second robot assembly 11B).

The system controller 101 is adapted to control the position and motion of the various components used to complete the transferring process. The system controller 101 is generally designed to facilitate the control and automation of the overall system and typically includes a central processing unit (CPU) (not shown), memory (not shown), and support circuits (or I/O) (not shown). The CPU may be one of any form of computer processors that are used in industrial settings for controlling various system functions, chamber processes and support hardware (e.g., detectors, robots, motors, gas sources hardware, etc.) and monitor the system and chamber processes (e.g., chamber temperature, process sequence throughput, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 101 determines which tasks are performable on a substrate. Preferably, the program is software readable by the system controller 101 that includes code to perform tasks relating to monitoring and execution of the processing sequence tasks and various chamber process recipe steps.

Referring to FIG. 2B, in one aspect of the invention the first robot assembly 11A is adapted to access and transfer substrates between the processing chambers in the first processing rack assembly 60 from at least one side, e.g., the side 60B. In one aspect, the second robot assembly 11B is adapted to access and transfer substrates between the processing chambers in the second processing rack assembly 80 from at least one side, e.g., the side 80A. In one aspect, it is desirable to only allow the first robot assembly 11A to access the processing chambers contained in the first processing rack assembly 60 and only allow the second robot assembly 11B to access the processing chambers contained in the second processing rack assembly 80 to prevent robot collisions and reduce the number of process variables that each substrate is exposed to (e.g., transfer time, robot blade temperature) during a desired processing sequence.

In one embodiment, the first robot assembly 11A and the second robot assembly 11B are both adapted to "overlap" or access and transfer substrates between the processing chambers in the first processing rack assembly 60 from side 60B and the second processing rack assembly 80 from side 80A. The ability to extend the robot blade 87 into a processing chamber and retract the robot blade 87 from the processing chamber is generally completed by cooperative movement of the components contained in the horizontal motion assembly 90, vertical motion assembly 95, and robot hardware assembly 85, and by use of commands sent from the system controller 101. The ability of two or more robots to "overlap" with one another, such as the first robot assembly 11A and the second robot assembly 11B, is advantageous since it allows substrate transfer redundancy which can improve the cluster reliability, uptime, and also increase the substrate throughput. Robot "overlap" is generally the ability of two or more robots to access and/or independently transfer substrates to and from the same processing chamber. The ability of two or more robots to redundantly access processing chambers can be an important aspect in preventing system robot transfer bottlenecks, since it allows an under utilized robot to help out a robot that is limiting the system throughput. Therefore, the substrate throughput can be increased, a substrate's wafer history can be made more repeatable, and the system reliability can be improved through the act of balancing the load that each robot takes during the processing sequence.

In one aspect of the invention, the various overlapping robot assemblies (e.g., elements 11A, 11B, etc. in FIGS. 2-7) are able to simultaneously access processing chambers that are horizontally adjacent (x-direction) or vertically adjacent (z-direction) to each other. For example, when using the cluster tool configurations illustrated in FIGS. 2B and 2F, the first robot assembly 11A is able to access processing chamber CD6 in the first processing rack assembly 60 and the second robot assembly 11B is able to access processing chamber CD5 simultaneously without colliding or interfering with each other. In another example, when using the cluster tool configurations illustrated in FIGS. 2B and 2F, the first robot assembly 11A is able to access processing chamber C6 in the second processing rack assembly 80 and the second robot assembly 11B is able to access processing chamber BC11 simultaneously without colliding or interfering with each other.

In one aspect, the system controller 101 is adapted to adjust the substrate transfer sequence through the cluster tool based on a calculated optimized throughput or to work around processing chambers that have become inoperable. The feature of the system controller 101 which allows it to optimize throughput is known as the logical scheduler. The logical scheduler prioritizes tasks and substrate movements based on inputs from the user and various sensors distributed throughout the cluster tool. The logical scheduler may be adapted to review the list of future tasks requested of each of the various robots (e.g., front end robot assembly 15, first robot assembly 11A, second robot assembly 11B etc.), which are retained in the memory of the system controller 101, to help balance the load placed on each of the various robots. The use of a system controller 101 to maximize the utilization of the cluster tool will improve the cluster tool's CoO, makes the wafer history more repeatable, and can improve the cluster tool's reliability.

In one aspect, the system controller 101 is also adapted to prevent collisions between the various overlapping robots and optimize the substrate throughput. In one aspect, the system controller 101 is further programmed to monitor and control the motion of the horizontal motion assembly 90, a vertical motion assembly 95, and a robot hardware assembly 85 of all the robots in the cluster tool to avoid a collision between the "overlapping" robots and improve system throughput by allowing all of the robots to be in motion at the same time. This so called "collision avoidance system," may be implemented in multiple ways, but in general the system controller 101 monitors the position of each of the robots by use of various sensors positioned on the robot(s) or in the cluster tool during the transferring process to avoid a collision. In one aspect, the system controller is adapted to actively alter the motion and/or trajectory of each of the robots during the transferring process to avoid a collision and minimize the transfer path length.

Referring to FIG. 2B, in one embodiment, the first interface chamber 48 and/or the second interface chamber 49 are configured to perform an optical edge bead removal process (OEBR), a substrate chill process, or an integrated bake and chill process. An example of an exemplary optical edge bead removal chamber, a substrate chill chamber or an integrated bake and chill chamber that may be adapted to benefit one or more aspects of the invention is further described in the commonly assigned U.S. patent application Ser. No. 11/112,281, filed Apr. 22, 2005, which is hereby incorporated by reference in its entirety to the extent not inconsistent with the claimed invention. In one embodiment, the first interface chamber 48 and/or the second interface chamber 49 are adapted to perform metrology type functions and communicate the results to the user through the controller 101. In one aspect, the interface chambers 48, 49 contain an array of vertically stacked metrology chambers (not shown) so that multiple substrates can be processed in parallel. In one aspect, the interface chambers 48, 49 contain a multiple metrology chambers (not shown) and multiple exchange chamber position (not shown) similar to the one illustrated in FIG. 3. Typical metrology chambers may include, but is not limited to conventional particle measurement tools, conventional resist thickness measurement tools, and/or conventional CD measurement tools.

Interface Robot Configurations

In one embodiment, as shown in FIGS. 2A-2F, the central module 25 has a first rear robot assembly 40A, second rear robot assembly 40B and an interface assembly 47 that are adapted to interface with an external module 5, such as a stepper/scanner device 50 to allow a seamless processing sequence. In this configuration the first rear robot assembly 40A, second rear robot assembly 40B and an interface robot 46 contained in the interface assembly 47 are adapted to transfer and control the substrate movement between the cluster tool 10 and the external module 5. In one aspect, the first rear robot assembly 40A and second rear robot assembly 40B are adapted to transfer substrates between the processing chambers retained in the first processing rack assembly 60 and/or the second processing rack assembly 80 and positions within the interface assembly 47 or positions within the external module 5. In one aspect, the external module 5 is conventional stepper or scanner module available from, for example, Nikon Precision Inc. of Belmont, Calif., Canon U.S.A. Inc. of Lake Success, N.Y., or ASML US Inc. of Tempe, Ariz. In one embodiment, the first rear robot assembly 40A and second rear robot assembly 40B are adapted to directly access and position substrates within the external module 5. In one aspect, it may be desirable to eliminate the interface robot 46 from the cluster tool configuration when the first rear robot assembly 40A and second rear robot assembly 40B are adapted to directly access and position substrates within the external module 5.

Referring to FIG. 2B, in one aspect, the first rear robot assembly 40A and the second rear robot assembly 40B generally contains a conventional selectively compliant articulated robot arm (SCARA) robots having a single arm/blade 40E. In another embodiment, the first rear robot assembly 40A and the second rear robot assembly 40B may be a SCARA type of robot that has two independently controllable arms/blades (not shown) to exchange substrates and/or transfer substrates in groups of two. The two independently controllable arms/blade type robot may be advantageous, for example, where the robot has to remove a substrate from a desired position prior to placing the next substrate in the same position. An exemplary two independently controllable arms/blade type robot may be purchased from Asyst Technologies in Fremont, Calif.

In one embodiment, the interface assembly 47 generally contains the interface robot 46, a first interface chamber 48 and a second interface chamber 49 that are adapted to position and control the movement of substrates between various load/unload positions within the external module 5. In one embodiment, the first interface chamber 48 and the second interface chamber 49 are pass-through type chambers that allow substrates moving from the central module 25 to the external module 5 or from the external module 5 to the central module 25 to be handed off between the stepper interface robot 46 and the respective rear robot assemblies, such as the first rear robot assembly 40A or the second rear robot assembly 40B. This configuration is advantageous since it allows the stepper interface robot 46 to control the transfer of the substrates between the external module 5 and the central module 25. The use of the stepper interface robot 46 can also be used to free-up the rear robot assemblies (e.g., items #40A and 40B) to perform the critical tasks at the time when they arise rather than waiting until tasks of lower importance be completed.

Exchange Chamber

Figure 3:
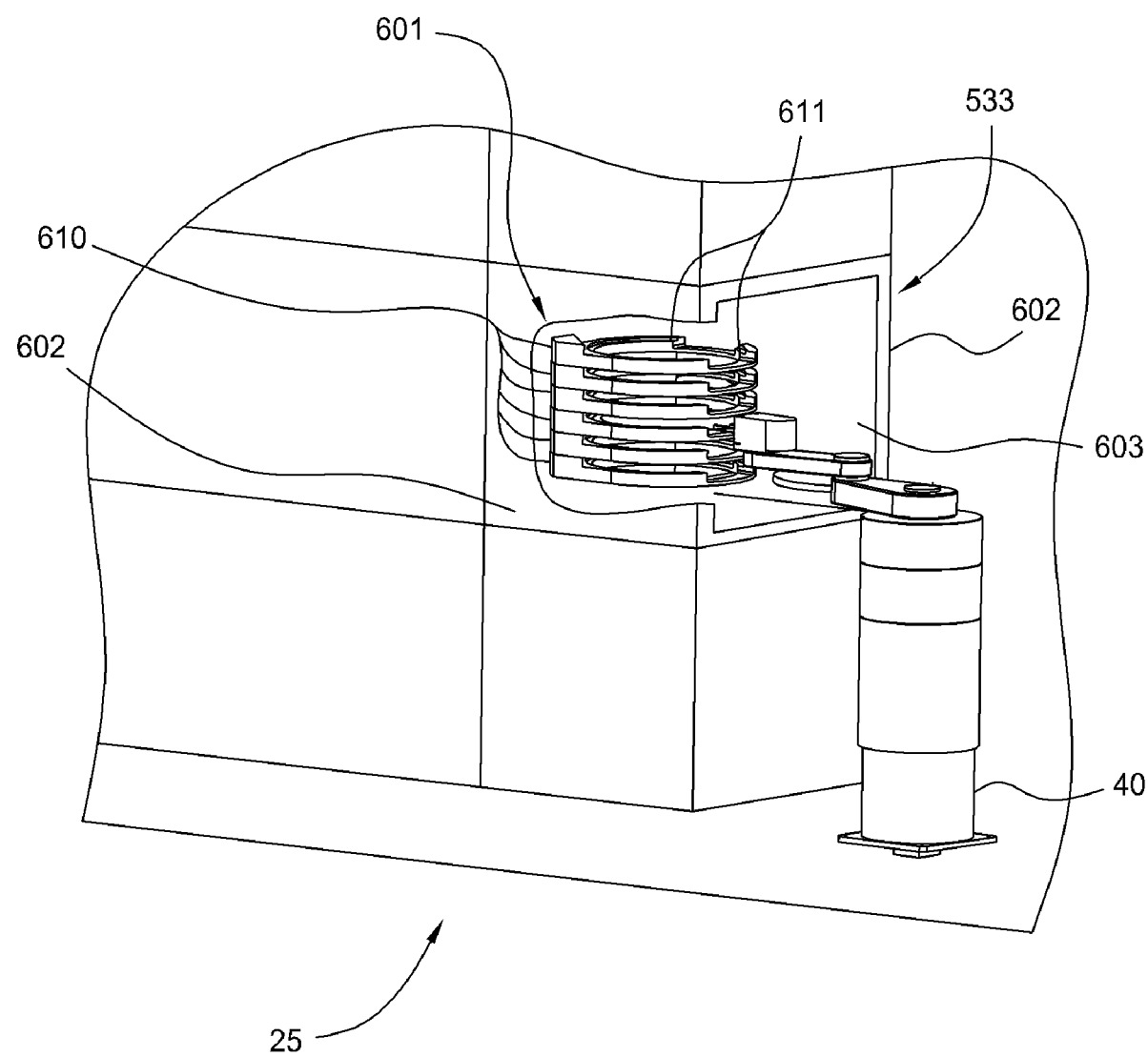
FIG. 3 is a side view of one embodiment of an exchange chamber, according to the present invention.

FIG. 3 illustrates one embodiment of an exchange chamber 533 that may be positioned in a support chamber 165 (FIG. 2F) in a processing rack (e.g., elements 60, 80). In one embodiment, the exchange chamber 533 is adapted to receive and retain a substrate so that at least two robots in the cluster tool 10 can deposit or pickup a substrate. In one aspect, the rear robot assembly 40 and at least one robot in the central module 25 are adapted to deposit and/or receive a substrate from the exchange chamber 533. The exchange chamber 533 generally contains a substrate support assembly 601, an enclosure 602, and at least one access port 603 formed in a wall of the enclosure 602. The substrate support assembly 601 generally has a plurality of support fingers 610 (six shown in FIG. 3) which have a substrate receiving surface 611 to support and retain a substrate positioned thereon. The enclosure 602 is generally a structure having one or more walls that enclose the substrate support assembly 601 to control the environment around the substrates while they are retained in the exchange chamber 533. The access port 603 is generally an opening in a wall of the enclosure 602 that allows an external robot access to pickup and drop off substrates to the support fingers 610. In one aspect, the substrate support assembly 601 is adapted to allow substrates to be positioned on and removed from the substrate receiving surface 611 by two or more robots that are adapted to access the enclosure 602 at angles of at least 90 degrees apart.

B. Transfer Sequence Example

FIG. 2C illustrates one example of a substrate processing sequence 500 through the cluster tool 10, where a number of process steps (e.g., elements 501-518) may be performed after each of the transferring steps $A_1$-$A_{11}$ have been completed. One or more of the process steps 501-518 may entail performing lithography type fluid processing steps on a substrate, to deposit a material on a surface of the substrate, to clean a surface of the substrate, to develop the deposited material on the substrate surface, or to exposing the substrate to some form of radiation to cause a physical or chemical change to one or more regions on the substrate. FIG. 2D illustrates an example of the transfer steps that a substrate may follow as it is transferred through a cluster tool that is configured as the cluster tool similar to the one shown in FIG. 2B following the processing sequence 500 described in FIG. 2C. In this embodiment, the substrate is removed from a pod assembly 105 (item # 105D) by the front end robot assembly 15 and is delivered to a chamber positioned at the pass-through position 9B following the transfer path $A_1$, so that the pass-through step 502 can be completed on the substrate. In one aspect, the pass-through step 502 entails positioning or retaining the substrate so that another robot could pickup the substrate from the pass-through position 9B.

Once the pass-through step 502 has been completed, the substrate is then transferred to a first process chamber 531 by the second robot assembly 11B following the transfer path $A_2$, where process step 504 is completed on the substrate. After completing the process step 504 the substrate is then transferred to the second process chamber 532 by the second robot assembly 11B following the transfer path $A_3$. After performing the process step 506 the substrate is then transferred by the second robot assembly 11B, following the transfer path $A_4$, to the exchange chamber 533 (FIG. 3). After performing the process step 508 the substrate is then transferred by the first rear robot assembly 40A, following the transfer path $A_5$, to the first interface chamber 48 where the process step 509 is performed. After performing process step 509 the substrate is then transferred by the stepper interface robot 46, following the transfer path $A_6$, to an exchange position 51 in the stepper/scanner module 50 where the process step 510 is performed. After performing process step 510 the substrate is then transferred by the stepper interface robot 46, following the transfer path $A_7$, to the second interface chamber 49 in the stepper interface assembly 47 where the process step 511 is performed. In one aspect, the process steps 509 and 511 entail positioning or retaining the substrate so that the first rear robot assembly 40A, second rear robot assembly 40B and/or the stepper interface robot 46 can pickup and transfer the substrate to a desired position. After performing process step 511 the substrate is then transferred by the second rear robot assembly 40B, following the transfer path $A_8$, to the process chamber 534 where the process step 512 is performed. After performing the process step 512 the substrate is then transferred by the first robot assembly 11A, following the transfer path $A_9$, to the process chamber 535 where the process step 514 is performed. After the process step 514 is complete, the first robot assembly 11A then transfers the substrate to a pass-through chamber positioned at the pass-through position 9A following the transfer path $A_{10}$ where a pass-through step 516 is performed. In one embodiment, the pass-through step 516 entails positioning or retaining the substrate so that another robot could pickup the substrate from the pass-through position 9A. After performing the pass-through step 516 the substrate is then transferred by the front end robot assembly 15, following the transfer path $A_{11}$, to the pod assembly 105D.

In one embodiment, process steps 504, 506, 510, 512, and 514 are a photoresist coat step, a bake/chill step, an exposure step performed in a stepper/scanner module 50, a post exposure bake/chill step, and a develop step, respectively, which are further described in the commonly assigned U.S. patent application Ser. No. 11/112,281, filed Apr. 22, 2005, which is incorporated by reference herein. The bake/chill step and the post exposure bake/chill steps may be performed in a single process chamber or they may also be transferred between a bake section and a chill section of an integrated bake/chill chamber by use of an internal robot (not shown). While FIGS. 2C-D illustrate one example of a process sequence that may be used to process a substrate in a cluster tool 10, process sequences and/or transfer sequences that are more or less complex may be performed without varying from the basic scope of the invention.

The cluster tool configuration described above may be advantageously used to perform processing sequences where a tight control of the timing between certain steps has to be maintained to assure that the wafer history and process results for each processed substrate is repeatable. For example, the timing between some lithography type process steps, such as between the exposure step 510 (see FIG. 2C) and a post exposure bake step (step 512 in FIG. 2C) are critical to assure that the process results (e.g., critical dimension (CD) uniformity) is acceptable and consistent from substrate to substrate. The timing issue in a lithography type process sequence generally arises after performing the exposure process (step 510 in FIG. 2C) on a positive photoresist material, which causes a chemical change in the photoresist material.

During the exposure process, components in the photoresist that contain photoacid generators (or PAGs) generate an organic acid that can attack the unexposed areas of the photoresist and affect the sharpness of the pattern formed in the photoresist layer during the exposure process. The attack of the unexposed photoresist is thus affected by the migration of the generated photoacid, which is a diffusion dominated process. Since the photoacid attack of the formed pattern is a diffusion dominated process, the rate of attack is dependent on two related variables, time and temperature. The control of these variables are thus important in assuring that CD uniformity is acceptable and consistent from substrate to substrate.

The configuration(s) illustrated herein, are useful to assure that timing of the transfer process during certain critical steps, such as between steps 510 through 512, is minimized and is repeatable by use of the three robot configuration. This process is important when the substrate throughput through the Cluster tool 10 and the stepper/scanner 50 is high, such as when it exceeds 120 substrates per hour, since the stepper/scanner 50 takes-in, processes and hands-off the substrates in less than 30 second intervals. Therefore, by assuring that at least one robot (e.g., first rear robot assembly 40A, second rear robot assembly 40B) is dedicated to assure that the substrates leaving the stepper/scanner 50 always see the same timing between process steps (e.g., steps 510 through 512) to assure that the device results are desirable and repeatable.

Second Cluster Tool Configuration

A. System Configuration

Figure 4A:
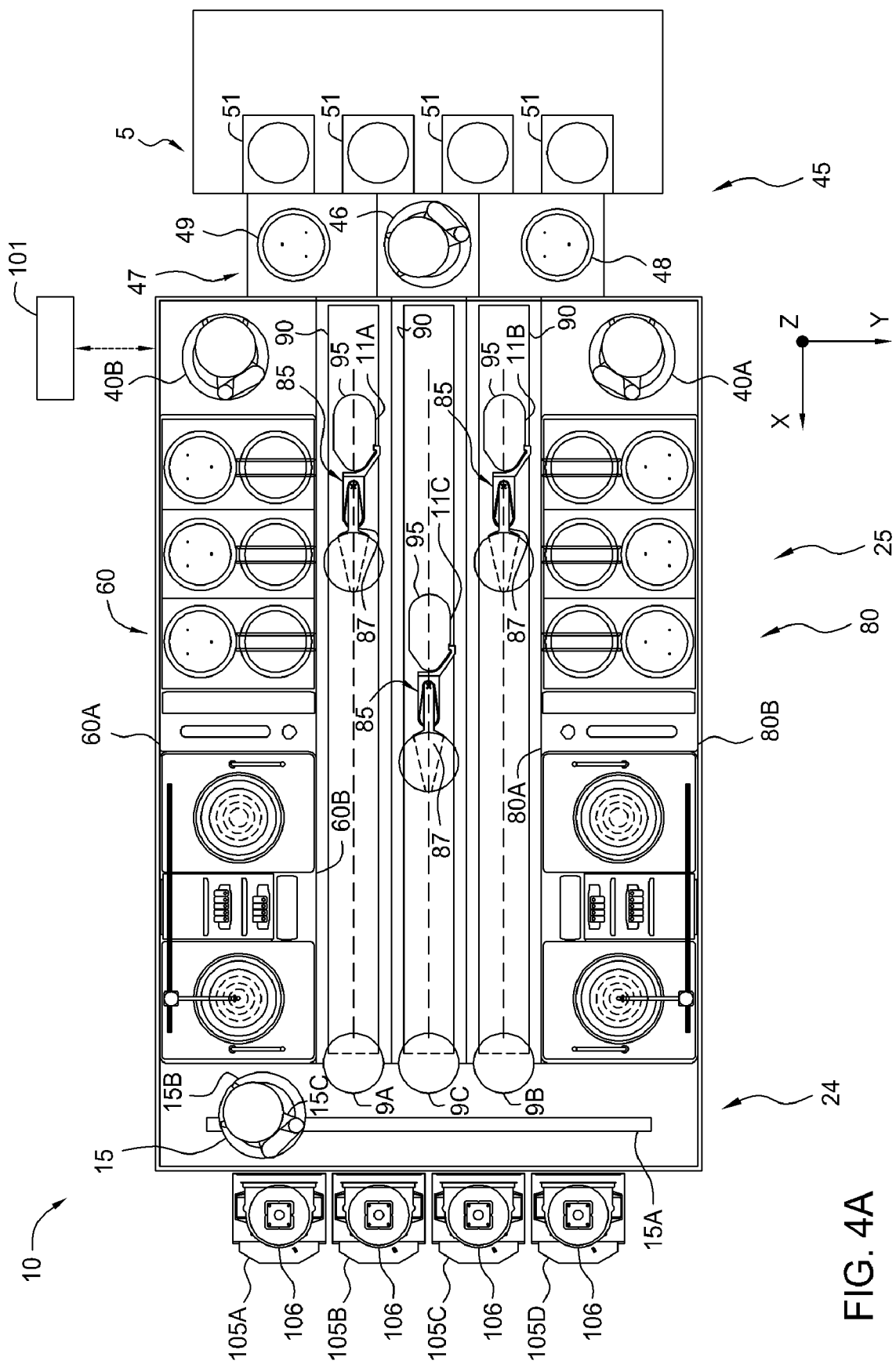
FIG. 4A is a plan view of a processing system, according to the present invention.

FIG. 4A is a plan view of one embodiment of cluster tool 10 that has a front end robot assembly 15, a rear robot assembly 40, a system controller 101 and three robot assemblies 11 (e.g., elements 11A, 11B, and 11C in FIG. 4A) positioned between two processing racks (elements 60 and 80), which are all adapted to perform at least one aspect of a desired substrate processing sequence using the various processing chambers found in the processing racks. The embodiment illustrated in FIG. 4A is similar to the configurations illustrated in FIGS. 2A-F except for the addition of the third robot assembly 11C and pass-through position 9C, thus like element numbers have been used where appropriate. The cluster tool configuration illustrated in FIG. 4A may be advantageous where the substrate throughput is robot limited, because the addition of the third robot assembly 11C will help to remove the burden on the other robots and also builds in some redundancy that allows the system to process substrates when one or more of the central robots become inoperable. In one aspect, the side 60B of the first processing rack assembly 60, and the side 80A of the second processing rack assembly 80 are both aligned along a direction parallel to the horizontal motion assembly 90 of each of the various robot assemblies (e.g., first robot assembly 11A, second robot assembly 11B, etc.).

In one aspect, the first robot assembly 11A is adapted to access and transfer substrates between the processing chambers in the first processing rack assembly 60 from side 60B. In one aspect, the second robot assembly 11B is adapted to access and transfer substrates between the processing chambers in the second processing rack assembly 80 from side 80A. In one aspect, the third robot assembly 11C is adapted to access and transfer substrates between the processing chambers in first processing rack assembly 60 from side 60B and the second processing rack assembly 80 from side 80A.

Figure 4B:
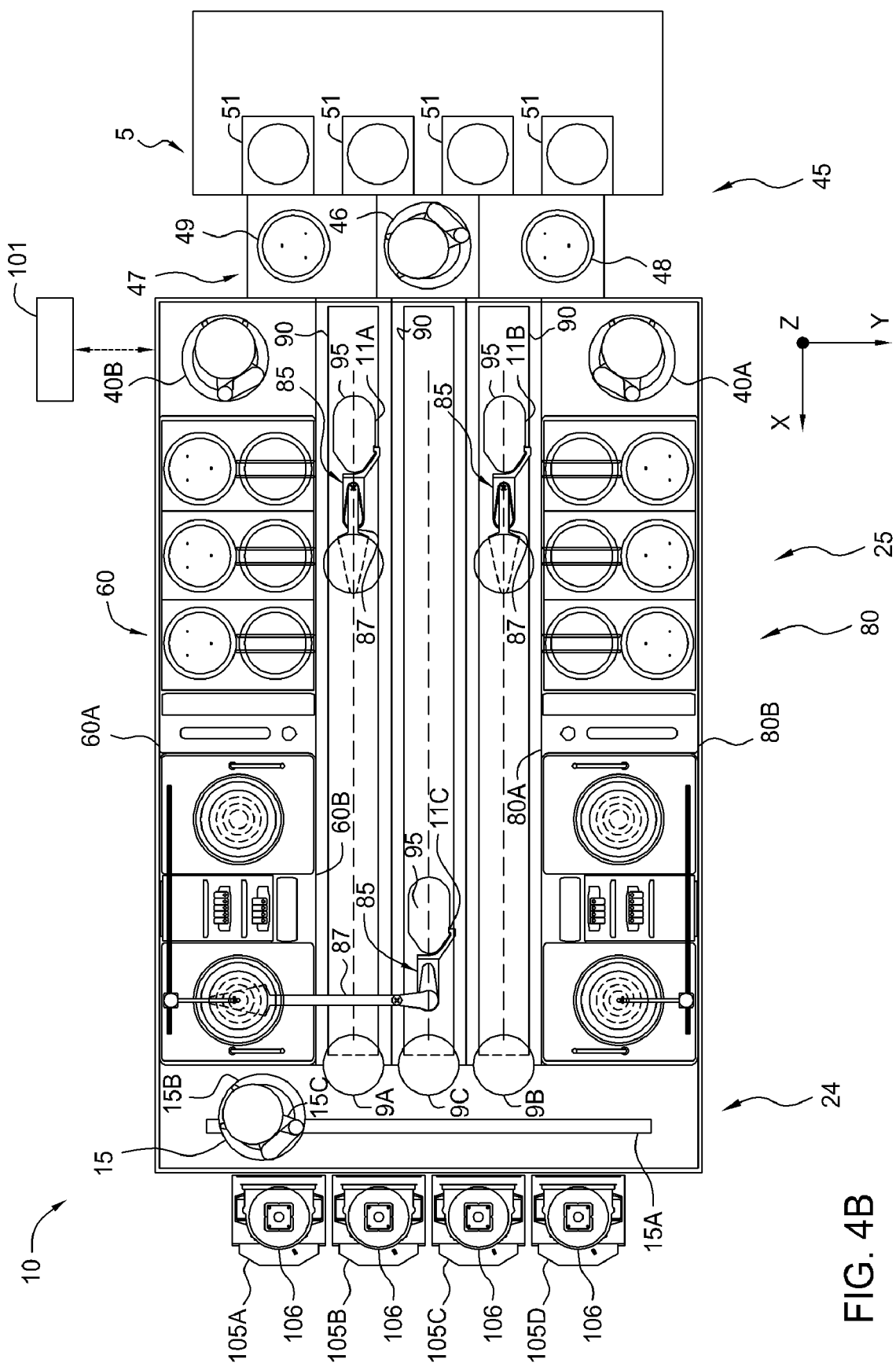
FIG. 4B is a plan view of a processing system illustrated in FIG. 4A, according to the present invention.

FIG. 4B illustrates a plan view of the embodiment of the cluster tool 10 shown in FIG. 4A, in which a robot blade 87 from the third robot assembly 11C has been extended into the a processing chamber in the first processing rack assembly 60 through side 60B. The ability to extend the robot blade 87 into a processing chamber and/or retract the robot blade 87 into a processing chamber is generally completed by cooperative movement of the robot assembly 11 components, which are contained in the horizontal motion assembly 90, a vertical motion assembly 95, and a robot hardware assembly 85, and by use of commands sent from the system controller 101. As discussed above the third robot assembly 11C along with the system controller 101 may be adapted to allow "overlap" between each of the robots in the cluster tool, may allow the system controller's logical scheduler to prioritizes tasks and substrate movements based on inputs from the user and various sensors distributed throughout the cluster tool, and may also use a collision avoidance system to allow robots to optimally transfer substrates through the system. Use of the system controller 101 to maximize the utilization of the cluster tool can improve the cluster tool's CoO, makes the wafer history more repeatable, and improves the system reliability.

Robot Assemblies

In general the various embodiments of the cluster tool 10 described herein have particular advantage over prior art configurations due to the reduced cluster tool foot print created by the reduced size of the robot assemblies (e.g., element 11 in FIG. 9A) and a robot design that minimizes the physical encroachment of a robot into a space occupied by other cluster tool components (e.g., robot(s), process chambers) during the process of transferring a substrate. The reduced physical encroachment prevents collisions of the robot with other foreign components. While reducing the footprint of the cluster tool, the embodiments of the robot described herein, also has particular advantage due to the reduced number of axes that need to be controlled to perform the transferring motion. This aspect is important since it will improve the reliability of the robot assemblies and thus the cluster tool. The importance of this aspect may be better understood by noting that the reliability of a system is proportional to the product of the reliability of each component in the system.

The embodiments of the cluster tool 10 described herein also have particular advantage over prior art configurations due to the reduced number of pass-through chambers (e.g., elements 9A-C in FIG. 2B), required to transfer a substrate though the cluster tool. The prior art cluster tool configurations commonly install two or more pass-through chambers, or of interim substrate retaining stations, in the processing sequence so that the cluster tool robots can transfer a substrate between one robot that is centrally positioned between one or more processing chambers to another robot that is centrally positioned between one or more other processing chambers during the processing sequence. The process of successively placing a substrate in multiple pass-through chambers that will not perform a subsequent processing step wastes time, decreases the availability of the robot(s), wastes space in the cluster tool, and increases the wear on the robot(s). The addition of the pass-through steps will also adversely affect device yield, due to the increase in the number of substrate handoffs which will increase the amount of backside particle contamination. Also, substrate processing sequences that contain multiple pass-through steps will inherently have different substrate wafer histories, unless the time spent in the pass-through chamber is controlled for every substrate.

Controlling the time in the pass-through chamber will increase the system complexity, due to an added process variable, and it will hurt the maximum achievable substrate throughput. In a case where the system throughput is robot limited, the maximum substrate throughput of the cluster tool is governed by the total number of robot moves to complete the process sequence and the time it takes to make the robot move. The time it takes a robot to make a desired move is usually limited by robot hardware, distance between processing chambers, substrate cleanliness concerns, and system control limitations. Typically the robot move time will not vary much from one type of robot to another and is fairly consistent industry wide. Therefore, a cluster tool that inherently has fewer robot moves to complete the processing sequence will have a higher system throughput than a cluster tool that requires more moves to complete the processing sequence, such as cluster tools that contains multiple pass-through steps.

The aspects of the invention, described herein, generally avoid these pitfalls of the prior art configurations, since the inventive cluster tool configuration generally only utilizes the pass-through type steps (e.g., steps 502, 508, 511 and 518 in FIG. 2C) before any processing has occurred on a substrate and after all of the processing steps have been completed on a substrate and thus the process timing and wafer history are not as much of an issue. In cases where a pass-through is positioned between time critical steps, such as step 511 in FIG. 2C, the cluster tool configuration illustrated herein is configured so that the robots performing these time critical steps can complete these tasks without affecting the movement and timing of the substrates upstream or downstream of this critical transfer process step.

For example, in a configuration such as the one shown in FIG. 1, the robot 17C needs to suspend any transferring tasks within its processing cell 16 to perform a time critical transferring task, which thus affects the timing and flow of substrates into and out-of the processing cells. To compensate for this problem the prior art configurations have to control, or regulate, the timing of substrates into and out-of each cell (e.g., item # 16 in FIG. 1) in the cluster tool to assure that each robot (e.g., item # 17A-17C in FIG. 1) has enough overhead time to assure that its time critical tasks can be completed and the wafer history is not dramatically affected. The process of controlling the timing of substrates into and out-of the processing cells in the prior art configurations to maintain a consistent wafer history dramatically reduces the substrate throughput, since the substrate throughput needs to be slowed so that conflicting substrate transferring priorities do not affect the timing between steps in all possible conflicting and non-conflicting situations.

The aspects of the invention described herein, decouple the flow of substrates through the critical transfer steps by providing one or more robots (e.g., robot 40B) that are specifically tasked with performing the critical timing steps while allowing other robots (e.g., robots 40A and 46) to perform the lower priority tasks. This configuration is especially advantageous where the throughput of the process sequence in the cluster tool 10 does not match the throughput of the external module 5 connected to the system. For example, when following the processing sequence shown in FIG. 2C if the throughput of substrates transferred to the chamber performing the exchange process 509 is faster than the throughput of the external module 5 the system through-put need not be reduced if the substrate is in a stable processing state after step 509 and thus will allow a repeatable wafer history. In one case the higher throughput into the chamber performing the exchange process 509 versus the throughput of the external module 5 is compensated by storing the substrates reaching the exchange chamber in multiple "buffer" positions (e.g., support fingers 610 in FIG. 3) so that they can then be picked-up and transferred to the external module 5 as needed. In another example, in the case where the throughput of substrates entering the external module 5 is slower than the exposure step 510 and/or the other down stream process steps (e.g., steps 511-518) the system through-put need not be coordinated with the upstream process steps and thus the system throughput need not be reduced.

The configuration of the novel cluster tool described herein is advantageous for multiple reasons. First, the process transferring of substrate in the configurations described herein doesn't require the same robots to transfer the substrates moving upstream and downstream at the same time, as required in the prior art systems shown in FIG. 1, and thus the creation of a substrate processing and/or a robot transferring bottleneck affects the upstream and downstream flow of substrates through the system. Second, the throughput can be greatly increased when the robot assemblies 11 and processing modules configured to process or transfer multiple substrates in parallel, since a bottleneck in the transferring process need not limit the substrate throughput. Third, the process results (e.g., CD uniformity) achieved on the processed substrate need not be degraded due to transferring process bottlenecks found in the upstream processes. The configurations described herein thus create a transferring process that has a repeatable wafer history, and delivers improved substrate process results and an improved substrate throughput.

Cartesian Robot Configuration

Figure 5:
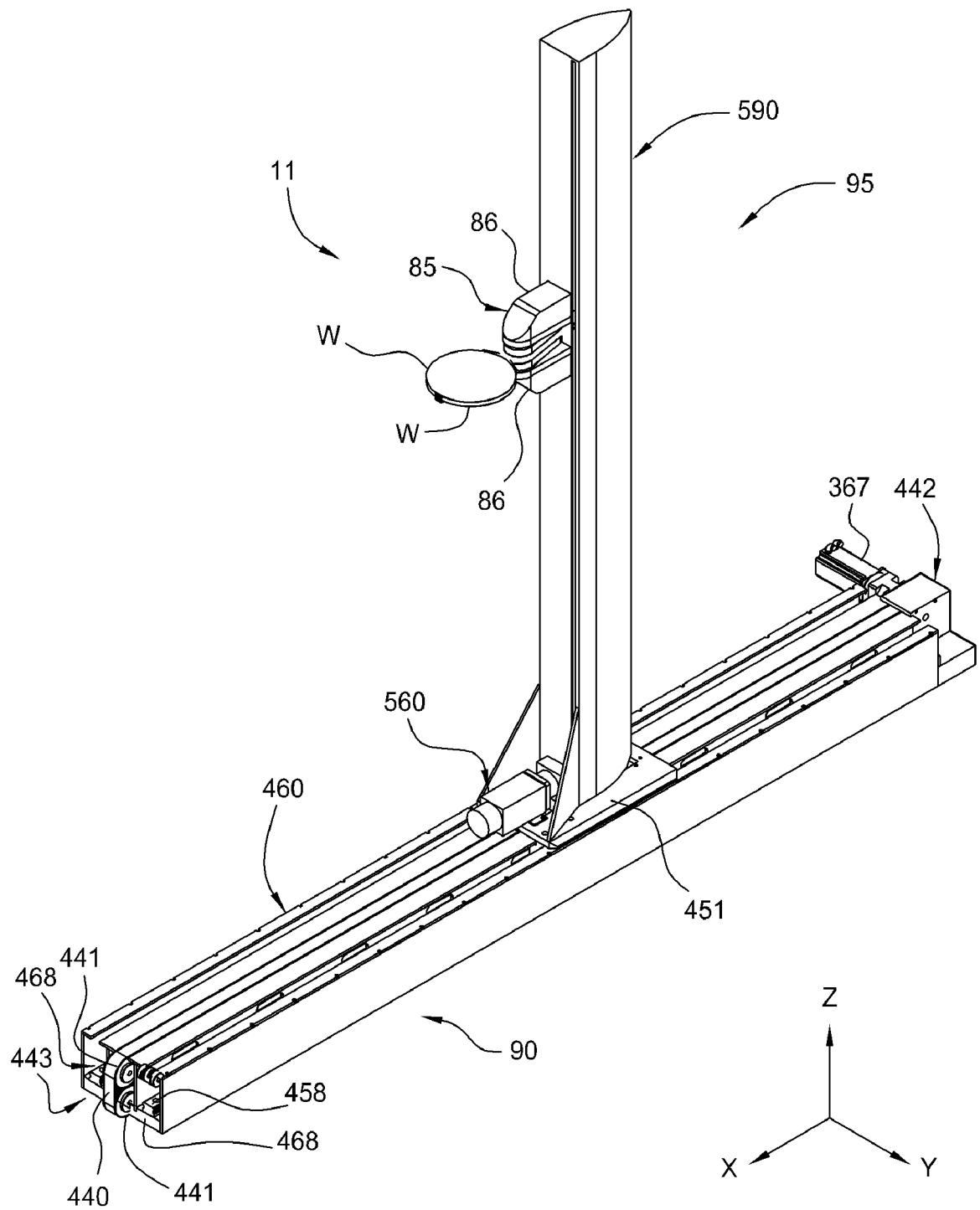
FIG. 5 is an isometric view illustrating one embodiment of a robot that may be adapted to transfer substrates in various embodiments of the cluster tool.

FIG. 5 illustrates isometric view of one embodiment of a robot assembly 11 that may be used as one or more of the robot assemblies 11 (e.g., elements 11A-C shown in FIGS. 2A-2F and FIGS. 4A-4B above). The robot assembly 11 generally contains a robot hardware assembly 85, one or more vertical robot assemblies 95 and one or more horizontal robot assemblies 90. A substrate can thus be positioned in any desired x, y and z position in the cluster tool 10 by the cooperative motion of the robot hardware assemblies 85, vertical robot assemblies 95 and horizontal robot assemblies 90, from commands sent by the system controller 101.

The robot hardware assembly 85 generally contains one or more transfer robot assemblies 86 that are adapted to retain, transfer and position one or more substrates by use of commands sent from the system controller 101. In one embodiment, the transfer robot assemblies 86 shown in FIG. 5 are adapted to transfer the substrates in a horizontal plane, such as a plane that includes the X and Y directions, due to the motion of the various transfer robot assemblies 86 components. An example of an exemplary robot hardware assembly that may be adapted to benefit one or more aspects of the invention are further described in the commonly assigned U.S. patent application Ser. No. 11/315,984, filed Dec. 22, 2005, which is hereby incorporated by reference in its entirety to the extent not inconsistent with the claimed invention. The configuration shown in FIG. 5, or "over/under" type blade configuration, may be advantageous, for example, where it is desired to remove a substrate from a processing chamber prior to placing the next substrate to be processed in the same processing chamber, without causing the robot hardware assembly 85 to leave its basic position to move the "removed" substrate to another chamber (i.e., "swap" substrates).

FIG. 5 illustrates an isometric view of one embodiment of the horizontal motion assembly 90. The horizontal motion assembly 90 generally contains an enclosure 460, an actuator assembly 443 and a sled mount 451. The actuator assembly 443 generally contains at least one horizontal linear slide assembly 468 and a motion assembly 442. The vertical motion assembly 95 is attached to the horizontal motion assembly 90 through the sled mount 451. The sled mount 451 is a structural piece that supports the various loads created as the vertical motion assembly 95 is positioned by the horizontal motion assembly 90. The horizontal motion assembly 90 generally contains two horizontal linear slide assemblies 468 that each have a linear rail 455, a bearing block (not shown) and a support mount (not shown) that support the weight of the sled mount 451 and vertical motion assembly 95. This configuration thus allows for a smooth and precise translation of the vertical motion assembly 95 along the length of the horizontal motion assembly 90. The linear rail 455 and the bearing block (not shown) may be linear ball bearing slides or a conventional linear guide, which are well known in the art. An example of an exemplary horizontal motion assembly that may be adapted to benefit one or more aspects of the invention are further described in the commonly assigned U.S. patent application Ser. No. 11/315,984, filed Dec. 22, 2005, which is hereby incorporated by reference in its entirety to the extent not inconsistent with the claimed invention.

FIG. 5 also illustrate one embodiment of the vertical motion assembly 95. The vertical motion assembly 95 generally contains a vertical support (not shown), vertical actuator assembly 560, a support plate (not shown), and a vertical enclosure 590, that are adapted top control and position the robot assembly 85 in a vertical direction (e.g., z-direction in FIG. 5). An example of an exemplary vertical motion assembly that may be adapted to benefit one or more aspects of the invention are further described in the commonly assigned U.S. patent application Ser. No. 11/315,984, filed Dec. 22, 2005, which is hereby incorporated by reference in its entirety to the extent not inconsistent with the claimed invention.

Cluster Tool Configurability Design

In one aspect of the invention, the cluster tool is configured so that it is expandable by the addition of extra processing capability without greatly increasing the number of robots, increasing the system control complexity and the size of the cluster tool. As noted above, the prior art configurations that utilize the processing cell 16 configuration, as shown in FIG. 1, require the addition of a robot every time the processing capability needs to be increased above the original capacity of the system. This issue can lead to the undesirable case where an additional robot and additional pass-throughs need to be added to the cluster tool to service only a few additional processing chambers to achieve a desired system throughput. When this occurs, prior art cluster tool manufacturers often de-rate, or reduce, the maximum cluster tool throughput rather than adding an additional processing cell that will increase in cost and complexity of the cluster tool, and reduce the cluster tool's reliability. The cluster tool configuration described herein thus de-couples the issues of substrate throughput, process capability, system reliability and robot capacity, so that changing the system requirements does not require the adjustment of the other aspects or parameters in the system.

Figure 6:
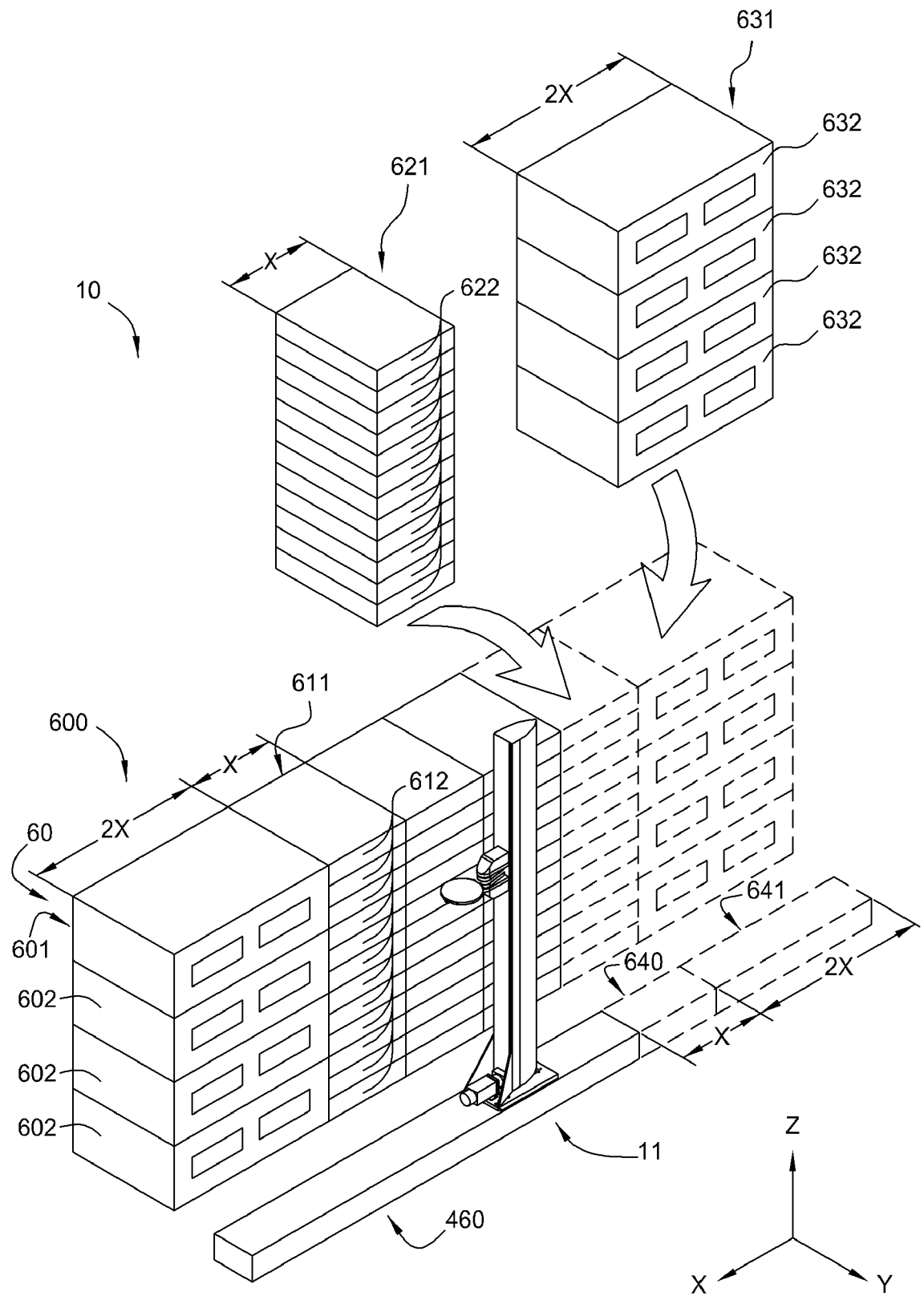
FIG. 6 is an isometric view illustrating one embodiment of a cluster tool of the invention.

Embodiments of the invention, described herein provide a modular approach to the configuration of cluster tool that allows the processing capability of the cluster tool to be increased without adding an additional substrate transferring apparatuses and pass-throughs, while only minimally increasing the system footprint. FIG. 6 is an isometric view of half of the cluster tool illustrated in FIG. 2A, for example processing rack 60 side of cluster tool 10, that illustrates a method of increasing the processing capability of the cluster tool 10 by adding of one or more stacked processing modules (e.g., items 621, 631) and increasing the robot length (e.g., items 640, 641). It should be noted that the addition of one or more stacked processing modules and increasing the length of one or more of the robot assemblies may be performed on one or more sides (e.g., processing rack 60, processing rack 80) of the cluster tool. The processing capability of cluster tool 10 is thus increased by the addition of stacked processing modules 621, 631, which contain multiple processing chambers 622 and 632, respectively.

In general, the addition of the stacked processing module 621 and/or stacked processing module 631 will require the robot assembly 11 to be extended a length 641 and/or length 642 to allow the robot to access the various processing chambers 622 and/or processing chambers 632 in the stacked processing modules. While the increase in the length of the cluster tool due to the addition of the stacked processing modules may increase the transfer time between chambers this component of the process of transferring a substrate is typically the smallest component of the transfer process overhead time. Typically the process of picking-up and dropping off of the substrate in the process chambers is the largest portion of the transferring process, which generally includes the steps of picking-up the substrate, transferring the substrate to the correct X, Y, and Z-positions, and dropping-off the substrate. It should be noted that the transferring process using a single robot that moves from one X, Y, and Z-position to another X, Y, and Z-position will be faster than the process of serially transferring a substrate between processing cells, as discussed above in reference to the prior art configuration shown in FIG. 1, due to the lack of the accumulation of multiple pick-up and drop-off transferring steps found in serial sequences.

In one embodiment, it may be desirable to add an additional robot assembly 11 to the cluster tool configuration to increase the throughput of the system (see FIG. 4A). The addition of another robot to the cluster tool configuration shown in FIG. 2B will not suffer all of the detrimental affects experienced by the prior art configurations, since the each robot assemblies 11 (e.g., items 11A, 11B and 11C in FIG. 4A) act in parallel rather than in series. In this case, while the overall reliability of the system will be reduced due to the addition of an additional component, but the uptime of the system will remain fairly constant due to the ability of the robots acting in parallel to take up the slack created when one of the robots becomes inoperable.

In one aspect, the processing rack assemblies (e.g., items 601, 611, 621, 631) are designed so that the widths of the stacked processing chambers aligned along a robot transfer direction, such as the X-direction in FIG. 6, are multiples of each other. Referring to FIG. 6, the width of the stacked processing module 601 is 2X and the width of the stacked processing module 611 is X, where X is some finite length, such as a width between about 0.4 meters and about 2.0 meters. The use of stacked processing chambers that have widths (e.g., X) that are multiples of one another (e.g., X, 2X, 3X) helps resolve some of the issues associated with grouping modules within a cluster tool that have differing shapes and sizes. In one example, the cluster tool contains processing modules that are configured in two discrete sizes where the smaller processing modules are about 0.5 meters in width and the larger process chambers are 1.0 meters in width. In another example, the cluster tool contains processing modules that are configured in two discrete sizes where the smaller processing modules are about 0.7 meters in width and the larger process chambers are 1.4 meters in width. This approach reduces the variability in robot lengths based on the make-up of the processing modules contained in the stacked processing modules and reduces the complexity of configuring systems for different processing applications.

Pass-Through Chamber Configuration

Figure 7:
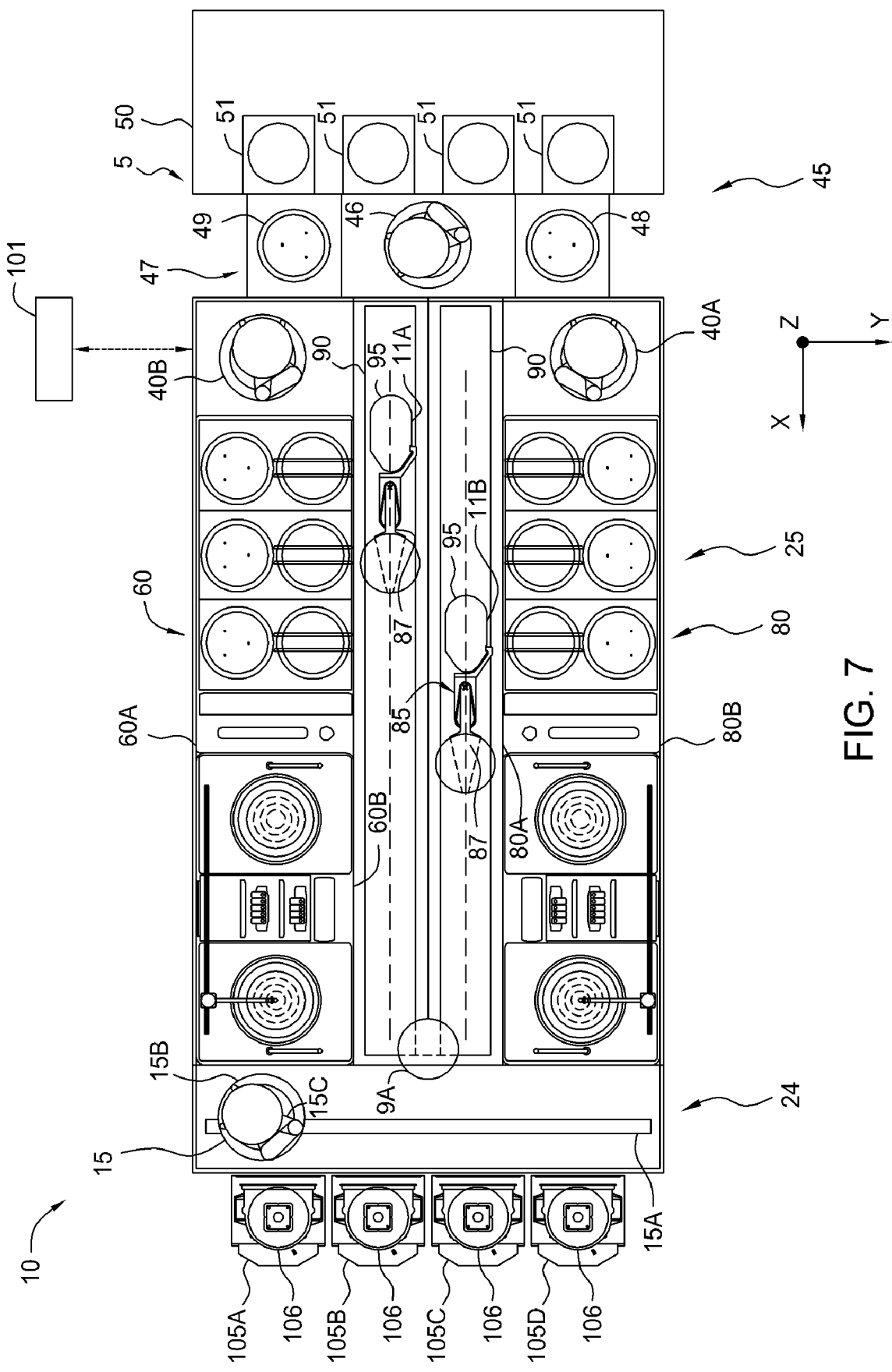
FIG. 7 is a plan view of the processing system according to one aspect of the present invention.

FIG. 7 is a plan view of the one embodiment of the cluster tool 10 that contains a multi-sided pass-through chamber 9A that is adapted to be accessed by multiple robots. In one aspect, the pass-through chamber is accessed by all of the central robot assemblies (e.g., first robot assembly 11A, second robot assembly 11B) and the front end robot assembly 15. Therefore, in one embodiment, as shown in FIG. 7 the pass-through position 9A is configured to allow the front end robot assembly 15, the first robot assembly 11A and the second robot assembly 11B to transfer a substrate to or from the pass-through position 9A. In one aspect, the transfer process may require a transferring step in which the first robot assembly 11A deposits a substrate on the pass-through position 9A where it is then picked up and transferred by the second robot assembly 11B to another desired position in the cluster tool. Referring to FIG. 2D and FIG. 7, whereas the transfer steps $A_1$-$A_2$ and $A_{10}$-$A_{11}$ found in FIG. 2D are transferred through two pass-through chambers 9A, 9B the configuration containing a multi-sided pass-through chamber allows the substrate to be exchanged through the single pass-through chamber 9A, as shown in FIG. 7.

While the foregoing is directed to embodiments of the present invention, other and further embodiments of the invention may be devised without departing from the basic scope thereof, and the scope thereof is determined by the claims that follow.

The invention claimed is:

1. A cluster tool for processing a substrate, comprising:
    a first processing rack comprising:
        a first group of two or more process chambers that are stacked in a vertical direction, each process chamber in the first group having a first width aligned along a first direction; and
        a second group of two or more process chambers that are stacked in the vertical direction, each process chamber in the second group having a second width aligned along the first direction;
    a first robot assembly translating in a direction parallel to the first direction and positioning a substrate in each of the process chambers in the first and second groups in the first processing rack;
    a second processing rack comprising:
        a third group of two or more process chambers that are stacked in the vertical direction, each process chamber in the third group having a third width aligned along the first direction; and
        a fourth group of two or more process chambers that are stacked in the vertical direction, each process chamber in the fourth group having a fourth width aligned along the first direction, wherein the fourth width is generally a multiple of the third width wherein the third width is between about 0.4 meters and about 2 meters; and
    a second robot assembly translating in a direction parallel to the first direction and positioning a substrate in each of the process chambers in the third and forth groups in the second processing rack.

2. The apparatus of claim 1, wherein the first width is between about 0.4 meters and about 1 meter and the second width is between about 0.8 meters and about 2 meters.

3. The apparatus of claim 1, further comprising:
    a third robot assembly that is in communication with a process chamber in the first processing rack and a first processing module in an interface assembly which is positioned adjacent to the first processing rack;
    a fourth robot assembly that is in communication with a process chamber in the second processing rack and a second processing module in the interface assembly which is positioned adjacent to the second processing rack; and
    a fifth robot assembly that is positioned within the interface assembly and is in communication with the first processing module and the second processing module, wherein the fifth robot communicates with an external module in the interface assembly.

4. The apparatus of claim 3, further comprising a pass-through chamber, wherein the pass-through chamber is accessed by the first robot assembly, the second robot assembly, and the fifth robot assembly.

5. The apparatus of claim 3, wherein the external module is selected from a group consisting of a stepper and a scanner.

6. The apparatus of claim 1, further comprising:
    a third robot assembly that is in communication with a process chamber in the first processing rack and an external module which is positioned adjacent to the first processing rack; and
    a fourth robot assembly that is in communication with a process chamber in the second processing rack and an external module which is positioned adjacent to the second processing rack.

7. The apparatus of claim 6, wherein the external module is selected from a group consisting of a stepper and a scanner.

8. The apparatus of claim 1, wherein the first direction is generally perpendicular to the vertical direction and the second width is generally a multiple of the first width.

9. The apparatus of claim 1, wherein the first robot assembly and the second robot assembly are contained within a central module.

10. The apparatus of claim 9, wherein the first robot assembly comprises:

a first robot having a robot blade and a substrate receiving surface located therein, wherein the first robot defines a transferring region and positions a substrate at one or more points generally contained within a first plane, the first plane is parallel to the first direction and a second direction which is orthogonal to the first direction;

a first motion assembly positioning the first robot in a third direction that is generally perpendicular to the first plane; and a second motion assembly positioning the first robot in a direction generally parallel to the first direction.

11. The apparatus of claim 9, further comprising a pass-through chamber positioned proximate the central module, wherein the pass-through chamber is accessed by the first robot assembly and the second robot assembly.

* * * * *

UNITED STATES PATENT AND TRADEMARK OFFICE
CERTIFICATE OF CORRECTION

| | | |
|---|---|---|
| PATENT NO. | : 7,819,079 B2 | |
| APPLICATION NO. | : 11/530297 | |
| DATED | : October 26, 2010 | |
| INVENTOR(S) | : Englhardt et al. | |

It is certified that error appears in the above-identified patent and that said Letters Patent is hereby corrected as shown below:

Title Page In the Related U.S. Application Data (60):

Please delete "Provisional application No. 60/673,848, filed on Apr. 22, 2005, provisional application No. 60/673,848, filed on Dec. 22, 2004." and insert -- Provisional application No. 60/673,848, filed on Apr. 22, 2005, provisional application No. 60/639,109, filed on Dec. 22, 2004. -- therefor;

Title Page In the References Cited (56):

Please insert -- 5,958,268 A 9/1999 Engelsberg et al. --.

Signed and Sealed this
Twenty-second Day of February, 2011

David J. Kappos
*Director of the United States Patent and Trademark Office*